(12) United States Patent
Honda

(10) Patent No.: US 8,138,788 B2
(45) Date of Patent: Mar. 20, 2012

(54) RECONFIGURABLE DEVICE

(75) Inventor: Hiroki Honda, Tokyo (JP)

(73) Assignee: Fuji Xerox Co., Ltd., Tokyo (JP)

( * ) Notice: Subject to any disclaimer, the term of this patent is extended or adjusted under 35 U.S.C. 154(b) by 676 days.

(21) Appl. No.: 11/915,819

(22) PCT Filed: May 31, 2006

(86) PCT No.: PCT/JP2006/310894
§ 371 (c)(1),
(2), (4) Date: Apr. 30, 2008

(87) PCT Pub. No.: WO2006/129722
PCT Pub. Date: Dec. 7, 2006

(65) Prior Publication Data
US 2009/0031106 A1    Jan. 29, 2009

(30) Foreign Application Priority Data
May 31, 2005    (JP) .................................. 2005-158460

(51) Int. Cl.
*G06F 17/50* (2006.01)
(52) U.S. Cl. ........................................... 326/38; 326/47
(58) Field of Classification Search ................... 326/38, 326/41, 47
See application file for complete search history.

(56) References Cited

U.S. PATENT DOCUMENTS

| | | |
|---|---|---|
| 5,426,378 A | 6/1995 | Ong |
| 5,646,545 A | 7/1997 | Trimberger et al. |

FOREIGN PATENT DOCUMENTS

| | | |
|---|---|---|
| JP | 02050617 A | 2/1990 |
| JP | 851356 | 2/1996 |
| JP | 9181599 | 7/1997 |
| JP | 11274915 A | 10/1999 |
| JP | 2001-267909 | 9/2001 |
| WO | WO-2005/022380 | 3/2005 |

OTHER PUBLICATIONS

Singh et al., Morphosys: an integrated reconfigurable system for data-parallel and computation-intensive applications, IEEE Transactions on Computers, 2002, pp. 1-35.*
Devereaux C. Chen, Programmable Arithmetic Devices for High Speed Digital Signal Processing, Dissertation, Depart ment of Electrical Engineering and Computer Science, University of California at Berkeley, 1992.*
International Preliminary Report on Patentability for PCT/JP2006/310894 dated Dec. 21 2007.

* cited by examiner

*Primary Examiner* — William M Treat

(57) ABSTRACT

There is provided a reconfigurable device that includes a plurality of processing blocks (13), wherein operation logic of each processing block is changeable, and a routing matrix (15) for configuring paths that connect the plurality of the processing blocks. Each processing block (13) includes a logic operation unit (21) whose logic is determined by configuration data (17) and a storage unit (40) for storing processing results of the logic operation unit. Each storage unit (40) includes a plurality of storage elements (31r), input means (32) for selecting one of the plurality of storage elements (31r) based on the configuration data (17) to store the output of the logic operation unit (21), and output means (33) for connecting the plurality of storage elements (31r) to the routing matrix (15).

5 Claims, 22 Drawing Sheets

Fig. 5

```
input   [3:0] fsmin;
output  [1:0] fsmout;
reg     [1:0] fsmout;
reg     [1:0] state, n_state;
reg     [2:0] xreg, yreg, n_xreg, n_yreg;
reg           aflg, bflg, cflg, dflg, n_aflg, n_bflg, n_cflg, n_dflg;

always @ (posedge clk) begin
  state <= n_state;
  {xreg, yreg} <= {n_xreg, n_yreg};
  {aflg,bflg,cflg,dflg} <= {n_aflg,n_bflg,n_cflg,n_dflg};
end always @ (state or fsmin or xreg or yreg
            or aflg or bflg or cflg or dflg) begin
  case (state)
  2'b00:
    begin
      n_aflg = !(fsmin[3] & bflg & (fsmin[2] ^ xreg[2]));
      n_cflg = & fsmin;
      n_dflg = | {xreg, fsmin};
      n_state = 2'b01;
      fsmout = xreg[1:0];
      {n_xreg,n_yreg,n_bflg} = {xreg,yreg,bflg};
    end                                                         (00)
  2'b01:
    begin
      n_bflg = aflg & fsmin[3] & (fsmin[0] | yreg[0]);
      n_xreg = {3{(aflg^fsmin[3])}} ^ yreg ^ fsmin[2:0];
      n_state = fsmin[3] ? 2'b11 : 2'b10;
      fsmout = yreg[1:0];
      {n_yreg,n_aflg,n_cflg,n_dflg} = {yreg,aflg,cflg,dflg};
    end                                                         (01)
  2'b10:
    begin
      tmp = ((fsmin[3]&fsmin[2])|(!fsmin[1]&!fsmin[0])) ? yreg : xreg;
      if (aflg ^ &tmp)
        n_state = &fsmin[2:0] ? 2'b11 : 2'b10;
      else
        n_state = 2'b00;
      n_aflg = fsmin[3] ^ |tmp;
      fsmout = tmp[0:1];
      {n_xreg,n_yreg,n_bflg,n_cflg,n_dflg} = {xreg,yreg,bflg,cflg,dflg};
    end                                                         (10)
  2'b11:
    begin
      n_yreg = {3{(bflg|(cflg&dflg))}} ^ fsmin[2:0];
      n_state = fsmin[0] ? 2'b01 : 2'b00;
      fsmout = {bflg, !(cflg|dflg)&(fsmin[3]^bflg)};
      {n_xreg,n_aflg,n_bflg,n_cflg,n_dflg} = {xreg,aflg,bflg,cflg,dflg};
    end                                                         (11)
  endcase
end
```

RECONFIGURABLE DEVICE

TECHNICAL FIELD

The present invention relates to a device including a reconfigurable logic circuit.

BACKGROUND ART

One example of a programmable logic device is a system called a "field programmable gate array" (FPGA). An FPGA includes a plurality of logic blocks that are configurable, i.e., the user can program (i.e., write) a desired logic function.

In PCT publication WO2005/022380 filed by the present applicant, dynamic optimization of a hardware space composed of reconfigurable logic circuits is disclosed. This publication states that in a reconfigurable system, it is possible to greatly reduce the assigning of hardware resources to functions that are not being used or are in a standby state so that the hardware resources can be collectively assigned to the processing to which the hardware resources should be assigned. If a hardware space is optimized, it becomes no longer necessary to install all of the hardware circuits as in a conventional dedicated or special-purpose LSI. This means that high execution efficiency can be achieved with few hardware resources.

One well-known method for improving the processing performance of a general-purpose processor is to raise the clock frequency. However, raising the clock frequency of the entire system to improve system performance is often undesirable for reasons such as power consumption. It would be conceivable to raise the clock frequency of only a unit (or group of functional hardware resources) where the processing power is insufficient, in such case, it would be necessary to install a circuit or function that compensates for the difference in clock frequency between the unit(s) with the raised clock frequency and other units, such as an input/output circuit. Demands for improvements in processing performance are also limitless. When the performance of a system that already has a high clock frequency to carry out processing at high speed is no longer sufficient, it will become necessary to operate the system at an even higher clock frequency. As a result, it becomes necessary to solve the problems of large power consumption and large generation of heat.

DISCLOSURE OF THE INVENTION

It is an object of the present invention to improve the efficiency with which logic is implemented in a reconfigurable logic circuit. Another object of the present invention is to make it easy to reconfigure the logic in a reconfigurable circuit in keeping with the processing state of other circuits. It is yet another object of the present invention to make effective use of hardware resources by switching the logic.

One aspect of the present invention is a device including a plurality of processing blocks, wherein operation logic of each processing block is changeable, and a routing matrix for configuring paths that connect the plurality of processing blocks. Each processing block included in the plurality of processing blocks includes a logic operation unit whose logic is determined by configuration data and a storage unit for storing operation results of the logic operation unit. The storage unit includes a plurality of storage elements, input means for selecting, based on the configuration data, one of the plurality of storage elements and storing an output of the logic operation unit, and output means for connecting the plurality of storage elements to the routing matrix.

Each processing block included in this reconfigurable device includes a larger number of storage elements than the number of outputs of the logic operation unit included in the processing block, with it being possible to store the output of the logic operation unit in one of such storage elements. In addition, selecting the storage element that stores the output of the logic operation unit is made based on configuration data that has a function of controlling the logic of the logic operation unit. Accordingly, the output of the logic operation unit in a given cycle can be stored in a storage element based on the configuration data, and in the next cycle the logic operation unit can carry out the next logic operation. As the output of the processing block, in any of the later cycles, it is possible to output an operation result stored in a storage element regardless of the logic of the logic operation unit in such later cycle. Selecting a storage element based on the configuration data includes having the storage element designated by the configuration data itself or designated by another signal selected according to the configuration data.

The reconfigurable device should preferably further include a configuration data supplying unit for supplying one out of a plurality of sets of the configuration data from a configuration memory that stores the plurality of sets of the configuration data to each processing block; and a configuration control unit for determining next configuration data to be supplied next to each processing block. This reconfigurable device is suited to uses where a variety of applications are executed by autonomously reconfiguring the system using the configuration control unit. The reconfigurable device is also suited to uses where a large-scale circuit is realized by a small-scale device.

This reconfigurable device can increase the usage efficiency of each processing block in units of the configuration data. By changing the configuration data in cycle units to reconfigure the logic, the processing speed is also raised. Accordingly, instead of raising the clock frequency, or in addition to raising the clock frequency, by using a method that reconfigures the logic, it is possible to satisfy demand for high processing performance by a reconfigurable device.

The expression "configuration control unit" includes units for carrying out control in processing block units respectively. The expression "configuration control unit" also includes a unit for carrying out control in units of sections or groups composed of a plurality of processing blocks and controlling the logic of the processing blocks included in such plurality of processing blocks.

The configuration control unit may be included in the respective processing blocks and by controlling the configuration of each processing block. In such case, it is possible to control the configuration of each processing block with units of configuration data that correspond to each processing block. This means that a variety of constructions can be flexibly realized. There is also the possibility that the hardware resources required to construct the configuration control unit will increase. Also, there is the possibility that adjustments to the interface between adjacent processing blocks will need to be resolved for each configuration data. This means that a certain amount of time will be required to generate the configuration data, but this problem is limited at the generating stage of configuration data.

By controlling the configuration of the plurality of processing blocks using the configuration control unit, it is possible to reduce the hardware resources required for the configuration control unit. A possible further effect is that the configuration data is reduced. In addition, although the control method and construction can also be adapted to reconfiguring individual processing blocks, such method and system are suited to reconfiguring the configuration of a plurality of processing blocks together.

The expression "output means of the storage unit includes a means that enables the plurality of storage elements to be independently accessed from the routing matrix. With such means, processing blocks can select and refer to the respective storage elements in that the required data stored. This means that the usage efficiency of the data stored in the storage elements is high.

The expression "output means of the storage unit" also includes a means that selects one out of the plurality of storage elements, based on (i.e., in accordance with) the configuration data, and connects to the routing matrix. In many applications, there are many cases where one or a limited number of outputs stored in the storage elements are used as inputs of the same processing block or other processing blocks. Accordingly, the usage efficiency of the storage elements and the usage efficiency of the wiring resources of routing matrix for referring to the storage elements are improved.

In many cases, the output processed by the logic operation unit is used as an input for another processing block in the same cycle. Accordingly, the processing blocks should preferably be equipped with direct output means for connecting the output of the logic operation unit to the routing matrix in addition to the storage unit. It is also effective for the processing blocks to include output selecting means for selecting one of the output of the logic operation unit and the plurality of storage elements, based on the configuration data, and connecting to the routing matrix, The configuration data, should preferably include a signal and/or information that directly controls the input means and/or output means of the storage unit. By using the configuration data and/or the input data, it is possible to generate a signal for controlling the input means and/or output means of the storage unit based on the configuration data. It is possible to reduce the control information for the storage unit that is included in the configuration data. The storage unit should preferably include a storage control unit that generates a storage control signal that controls the input means and/or the output means. One aspect of the storage control unit is a unit that generates control signals from input data supplied from the routing matrix and the configuration data, based on the configuration data. When configuring a data path using a plurality of processing blocks and carrying out a multibit operation, it is effective for the configuration data to be able to set the storage control unit so that storage elements are selected from the input data supplied from the routing matrix.

The storage control unit may be included in each processing block, so that control of the storage unit by the configuration data has high flexibility. The storage control unit may alternatively be disposed in units of a section or group composed of a plurality of processing blocks, which makes it possible to reduce the hardware resources required to construct the storage control unit. A storage control unit disposed in units of a section or group composed of a plurality of processing blocks can control the individual processing blocks included in the sections or groups and is also suited to collective control of the plurality of processing blocks included in such sections or groups.

Another aspect of the present invention is a control system for a reconfigurable device. The reconfigurable device includes: a plurality of processing blocks, wherein operation logic of each processing block is changeable; and a routing matrix for configuring paths that connect the plurality of processing blocks, wherein each processing block includes: a logic operation unit whose logic is determined by configuration data; and a storage unit for storing operation results of the logic operation unit, and the storage unit includes: a plurality of storage elements; input means for selecting one of the plurality of storage elements, based on the configuration data, and storing an output of the logic operation unit; and output means for connecting the plurality of storage elements to the routing matrix. The control system includes, when mapping cycle-based circuits onto the plurality of processing blocks, assigning, according to the configuration data, different registers for inputting and/or outputting that are included in the cycle-based circuits to different storage elements that are included in the plurality of storage elements.

Yet another aspect of the present invention is a control method for a reconfigurable device. The reconfigurable device includes: a plurality of processing blocks like those described above and a routing matrix, wherein the processing blocks include: a logic operation unit whose logic is determined by configuration data; and a storage unit for storing operation results of the logic operation unit, and the storage unit includes: a plurality of storage elements; input means for selecting one of the plurality of storage elements, based on the configuration data, and storing an output of the logic operation unit; and output means for connecting the plurality of storage elements to the routing matrix. The control method includes, when mapping cycle-based circuits onto the plurality of processing blocks, assigning, according to the configuration data, different registers for inputting and/or outputting that are included in the cycle-based circuits to different storage elements that are included in the plurality of storage elements.

The reconfigurable device should preferably include a configuration data supplying unit for supplying one out of a plurality of sets of the configuration data from a configuration memory that stores the plurality of sets of the configuration data to the processing blocks, and the control method should preferably include determining next configuration data to be supplied next to each processing block. Determining the next configuration data includes determining the next configuration data in units of processing blocks. Determining the next, configuration data also includes determining the next configuration data in units of a plurality of processing blocks.

Yet another aspect of the present invention is a system for generating configuration data for a reconfigurable device. The reconfigurable device includes a plurality of processing blocks like those described above and a routing matrix. The system includes: means for generating cycle-based RTL descriptions for a user circuit; means for carrying out logic synthesis of the cycle-based RTL descriptions in each cycle; and means for generating the configuration data for assigning different registers for inputting and/or outputting that are included in the cycle-based circuits provided by the logic synthesis to different storage elements when mapping the cycle-based circuits onto the plurality of processing blocks.

Yet another aspect of the present invention is a method of generating configuration data for a reconfigurable device. The reconfigurable device includes: a plurality of processing blocks like those described above and a routing matrix. The method includes steps of:

1. generating cycle-based RTL descriptions for a user circuit;

2. carrying out logic synthesis of the cycle-based RTL descriptions in each cycle; and 3. generating the configuration data for assigning different registers for inputting and/or outputting that are included in the cycle-based circuits provided by the logic synthesis to different storage elements that are included in the plurality of

BRIEF DESCRIPTION OF THE DRAWINGS

FIG. 5 shows one example of an RTL description of a user circuit.

FIG. 13(a) shows a state 00, FIG. 13(b) shows a state 01, FIG. 13(c) shows a state 10, and FIG. 13(d) shows a state 11.

FIG. 14(a) shows a state 00, FIG. 14(b) shows a state 01, FIG. 14(c) shows a state 10, and FIG. 14(d) shows a state 11.

FIG. 20(a) shows a state 0 and FIG. 20(b) shows a state 1.

FIG. 21(a) shows a state 00, FIG. 21(b) shows a state 01, FIG. 21(c) shows a state 10, and FIG. 21(d) shows a state 11.

FIG. 24(a) shows a state 0 and FIG. 24(b) shows a state 1.

DETAILED DESCRIPTION

Figure 1:
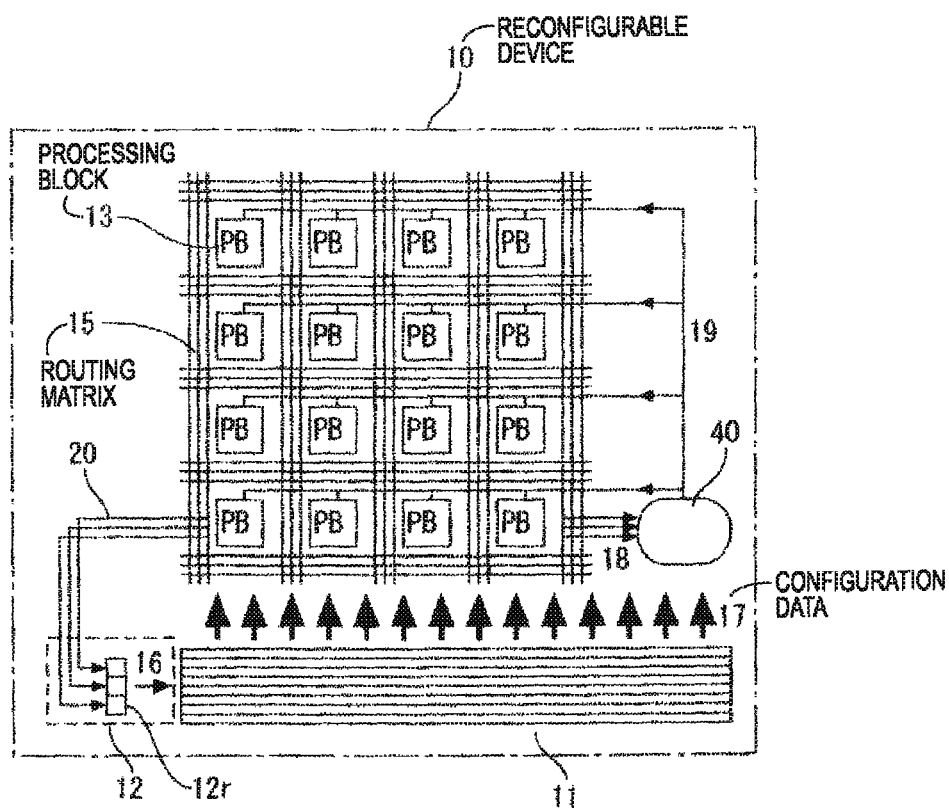
FIG. 1 is a block diagram showing an integrated circuit device that is one example of a reconfigurable device.

00 state
01 state
10 integrated circuit, or reconfigurable, device
11 configuration memory
12 configuration control unit
12r configuration designating register
13 Processing, or configuration logic, blocks
13a first processing block
13b second processing block
13c third processing block
13d fourth processing block
13t processing block
13u processing block
13v processing block
13w processing block
13x processing block
13y processing block
13z processing block
15 routing matrix
16 selection value
17 configuration data
17a *configuration data*
17b *configuration data*
17c *configuration data*
17d *configuration data*
18 signals
19 storage control signal
19e write enable signal
19i input control signal
19o output control signal
19t write enable signal
19oa output control signal
19ob output control signal
20 write signal
21 logic operating unit (LOU)
21a four-input decoder
21b sixteen-input, one-output selector
21c two-bit mode signal
23 input signal
24 function data
25 output signal
25a output result
25b output result
26 storage control components
27 routing matrix output selector information
28 output selection unit (output selector)
29 direct output line
30 storage unit
31 register group (multi, or multiple, FF)
31r storage element, or register
32 input unit or decoder
33 output unit or selector 33s two selectors
39 output signal
39a output signal
39b output signal
40 storage control unit
41 selector group
45 control signal
46 comparator
51 user circuit
52 user circuit
53 user circuit
71 generate cycle-based RTL
72 logic synthesis in cycle units
73 generate the configuration data
73a assign input/output registers to multi FF in accordance with rules
73b generate configuration data
79 processing block (PBS)
81 generate register transfer level (RTL)
82 logic synthesis
83 generate data for mapping
90 FPGA
91 Memory
92 logical operation unit
93 processing blocks
95 routing matrix
97 data for programming the processing blocks
98 Register
99 arbitary four-input logic function and output unit
100 System
101 generate cycle-based RTL
102 logic synthesis in cycle units
103 generate configuration data
111 reads data or specification of user circuit
112 device library
121 determine next configuration data
122 supply configuration d at of cycle units
130 data processing apparatus
131 interface (I/F)
132 configuration data file
133 Memory
134 control unit A device in which circuits can be reconfigured is one of the systems that dynamically optimizes a hardware space. One method of handling a momentary increase in processing load in this system is to increase the hardware resources assigned to the process with the increased processing load and to reduce the hardware resources assigned to other processes that have low urgency. In this system, if the amount of reconfigurable hardware resources is insufficient, there will be the risk that even if the assigning of the hardware resources is changed, it will not be possible to sufficiently respond to the demands for improved processing speed or to sufficiently respond to the demands for improved processing performance.

In a system that dynamically optimizes a hardware space, it will be possible to improve the processing performance by raising the clock frequency in the same way as with a conventional processor. However, like a conventional processor, raising the clock frequency cannot be said to be the most preferable solution for reasons such as power consumption.

In a reconfigurable system, instead of raising the clock frequency, or in addition to raising the clock frequency, it is possible to use a method that improves the processing performance by realigning the hardware resources to increase the parallelism of the processing. In a reconfigurable system, the hardware resources that were used for or diverted to the parallel execution of other processes or functions can be used to increase the parallelism of a process for which a high processing speed is required. That is, a reconfigurable system is a system in which the effective circuit scale can be increased by switching the logic, so that effective use can be made of hardware resources. Accordingly, to provide an economical reconfigurable system with a high processing speed, it is important to be able to flexibly use the reconfigurable hardware resources for a larger number of purposes.

An integrated circuit device will now be described as a reconfigurable device that is an embodiment of the present invention. This integrated circuit device includes a plurality of processing blocks and each processing block includes a logic operation unit whose logic can be changed according to configuration data and a larger number of storage elements than the number of outputs of the logic operation unit. By making it possible to select which storage element stores the output of the logic operation unit based on the configuration data, the output of the logic operation unit in a given cycle can be stored in a predetermined storage element based on the configuration data. This means that in each processing block, based on the configuration data, the output in a preceding cycle or the respective outputs En preceding cycles can be handled separately from or independently of the result (output) of a logic operation by the logic operation unit in the following cycle, or alternatively the output in a preceding cycle or the respective outputs in preceding cycles can be handled as separate data (a separate or individual data set) to the result (output) of a logic operation by the logic operation unit in the following cycle. This means that it is possible to use the individual processing blocks more flexibly in cycle units.

Accordingly, in the integrated circuit device of the embodiment described below, one method for mapping a user circuit to realize a user application includes the following processes.

a1. Generating cycle-based RTL (Register Transfer Level) descriptions of a user circuit.

a2. Perform logic synthesis on the cycle-based RTL descriptions in each cycle.

a3. Mapping the cycle-based circuits to the plurality of processing blocks so that registers with different inputs and/or outputs that are included in the cycle-based circuits provided by the logic synthesis, are assigned to different storage elements out of the plurality of storage elements by referring to or within an allowance of a rule.

Here, the "registers with different inputs and/or outputs that are included in the cycle-based circuits" include registers that store data referred to as inputs but whose meaning differs according to the logic operation and registers that latch data generated (outputted) by a different input and/or logic operation.

The rule is decided by the configuration of the storage units included in the processing blocks. For example, in a system where every storage element out of a plurality of storage elements can be freely referred to from a routing matrix, in a user circuit, it is possible to assign registers that are referred to as input registers respectively to the plurality of storage elements in a single processing block. In a system where one storage element selected out of a plurality of the storage elements is referred to from the routing matrix, when a circuit that requires a plurality of input registers is provided by the logic synthesis as one of cycle-based circuits for implementing a user circuit, the respective input registers are assigned not to the storage elements of a single processing block but to the storage elements of a plurality of processing blocks.

In this integrated circuit device, it is possible to store an operation result that will be required in a following cycle in one of the storage elements instead of carrying out processing every time the result is required. For example, in a system that includes N processing blocks, it is preferable for the N processing blocks to carry out the desired logic operations one after the other in each cycle. On the other hand, there are hardly any circuits where the operation results of all processing blocks are used in each cycle and are not required in a following cycle. When a result is required in the following cycle, it is possible to assign the logic operation for the result to a processing block and carry out the processing again to get the result. Instead of repeating the operation, it is possible to use data that has been stored in a storage element and therefore possible to improve the usage efficiency of the processing blocks.

The reconfigurable system according to the present embodiment makes it possible to select which storage element stores the output of a logic operation unit in each set of or at timing of changing the configuration data for determining the logic of the logic operation unit. When a plurality of logic operations are executed by a processing block, the operation logic of the logic operation unit included in the processing block is changed by each set of the configuration data or by timely changing the configuration data. It is also possible to select an operation result outputted from the processing block or ready to be selected by each set of the configuration data or by timely changing the configuration data independently of the operation logic of the logic operation unit.

This means that it is possible to separate, in a processing block, the timing of operation of the logic operation unit and the timing of requiring of output of such logic operation. Also, since it is possible to free up the logic operation unit immediately after the logic operation, maximum use can be made of the processing performance of logic operation unit in the processing block. Further, since it is possible to select the storage elements in which the outputs of the logic operation unit are stored, based on the configuration data that determines the logic of the logic operation unit, it is possible to have a plurality of logic operation results designated by the configuration data outputted from one processing block virtually even if single logic operation unit is included in the processing block. Also, in a processing block, since it is not necessary for a logic operation unit to repeatedly carry out the same logic operation to repeatedly output the same logic operation output, the logic operation unit can immediately switch to the next logic operation, thereby contributing to an improvement in the processing performance of the system.

FIG. 1 is a block diagram of an integrated circuit device that is an embodiment of a reconfigurable device according to the present invention. The integrated circuit device 10 includes a plurality of processing blocks (PBs) or configurable logic blocks (CLBs) (hereinafter simply "PB" or "PBs") 13 whose operation logic can be changed or varied, a routing matrix 15 for configuring paths (circuits, lines, wires, or transfer lines) that connect the plurality of processing blocks 13, a configuration memory 11 that stores a plurality of sets of configuration data 17, a configuration control unit 12 for supplying the configuration data 17, and a storage control unit 40 for controlling the storage units included in the processing blocks 13. The configuration control unit 12 supplies one of the plurality of sets of configuration data 17 from the configuration memory 11 to the processing blocks 13. The storage control unit 40 generates storage control signals 19 that control the storage units included in the processing blocks 13.

Figure 2:
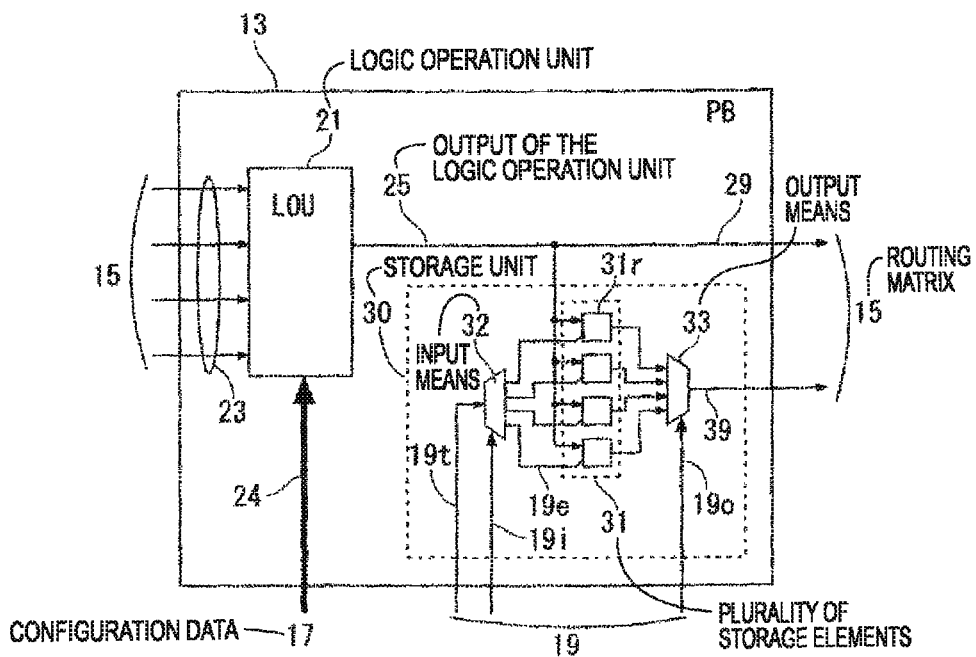
FIG. 2 is a block diagram showing a processing block (PB) included in the device shown in FIG. 1.

FIG. 2 is a block diagram of one example of a processing block 13. The PB 13 is equipped with a logic operating unit (logical operating unit, LOU) 21 whose logic is determined according to function data 24 included in the configuration data 17 and a storage unit 30 that stores the operation results of the LOU 21. The LOU 21 outputs one output signal 25 in response to four input signals 23. The storage unit 30 of the PB 13 temporarily stores the output signal 25 of the LOU 21. The storage unit 30 is equipped with a multi FF (multiple FF) 31 including four storage elements 31r which exceed the output signal 25 in number, an input unit for selecting one out of the plurality of storage elements 31r, according to the storage control signals 19, and storing the output signal 25 in the storage element 31r, and an output unit 33 for connecting the plurality of storage elements 31 to the routing matrix 15. The PB 13 is also equipped with a direct output line 29 that outputs the output signal 25 of the LOU 21 directly to the routing matrix 15.

Figure 3:
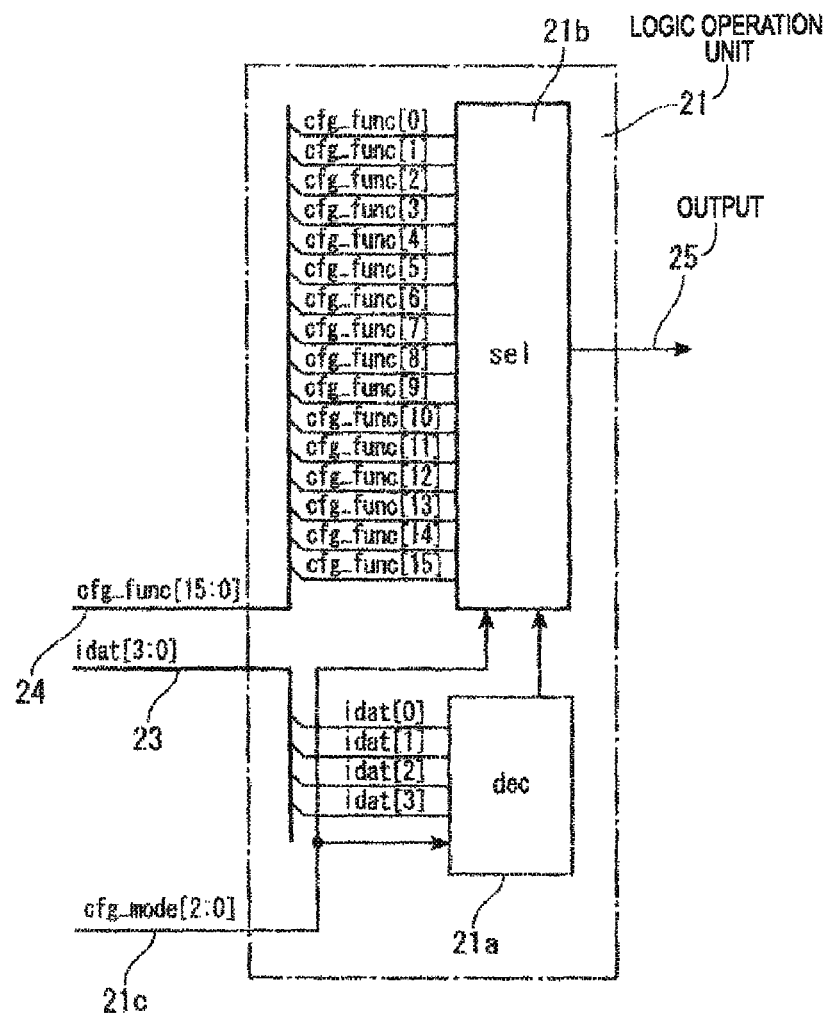
FIG. 3 is a block diagram showing one example of a logic operation unit (LOU) included in the PB shown in FIG. 2.

An example of a logic operation unit may be a lookup table-type function generating device. One example of a lookup table-type function generating device is a device implemented in an FPGA. A typical example of an LOU 21 is a device whose logic can be changed on a clock cycle basis (or simply "cycle basis"). FIG. 3 is a block diagram of a decoder-type logic operation circuit proposed by the present applicant in PCT publication WO2005/022380 and is one example of an LOU 21 whose logic can be changed or varied on a cycle basis.

The LOU 21 shown in FIG. 3 includes a four-input decoder 21a and a sixteen-input, one-output selector 21b. The LOU 21 selects and outputs a one-bit output signal 25 from the sixteen-bit function data 24 according to the four-bit input 23. According to a two-bit mode signal 21c, the LOU 21 is not limited to a four-input, one-output logic operation unit and can also function as a three-input, one-output logic operation circuit or as a two-input, one-output logic operation circuit. By changing the function data 24, it is possible to implement twenty or more types of logic, such as a four-input AND, a four-input NAND and other logics, in the LOU 21 in cycle units. The LOU 21 can process the input signal 23, which is supplied in cycle units, according to different logic, which is supplied in cycle units, and generate the output signal 25.

The storage unit 30 is equipped with a register group (hereinafter "multi FF" or "multiregister") 31 that includes four flip-flops or registers 31r. The four flip-flops or registers 31r are storage elements and the output signal 25 is supplied to the registers 31r. The output unit 33 of the storage unit 30 includes a selector. Hereinafter, the output unit 33 is also referred to as the "selector 33" or the "read selector 33". According to an output control signal 19o included in the storage control signals 19, the selector 33 selects a register 31r out of the multi FF 31 and makes ready to read out the present value thereof as an output signal 39.

The input unit 32 of the storage unit 30 includes a decoder. Hereinafter, the input unit 32 is also referred to as the "decoder 32". The decoder 32 selects one of the registers 31r of the multi FF 31 according to an input control signal 19i included in the storage control signals 19. The input unit 32 outputs a write enable signal 19t included in the storage control signals 19 to the selected register 31r as a write enable signal 19e.

In the reconfigurable device 10, one out of the configuration memory array 11 is selected in each clock cycle based on the value 16 of a configuration designating register 12r included in the configuration control unit 12. By doing so, the configuration data 17 is determined. According to the configuration data 17, the state of the PB 13, the storage control unit 40, and the configurable routing matrix 15 are designated in each clock cycle.

The storage control unit 40 generates the storage control signals 19 based on the configuration data 17. The storage control signals 19 are sent via the configurable routing matrix 15 to the storage unit 30 of each PB 13. According to storage control data included in the configuration data 17, the storage control unit 40 generates the storage control signals 19 using the storage control data. Alternatively, according to storage control data included in the configuration data 17, the storage control unit 40 generates the storage control signals 19 using signals 18 obtained from the configurable routing matrix 15.

Based on the output control signal (read register selection signal) 19o out of the storage control signals (register selection signals) 19, the read selector 33 of the storage unit 30 of the PB 13 selects one register 31r out of the multi FF 31. The selector 33 outputs the value stored in the selected register 31r to the configurable routing matrix 15. Alternatively, the selector 33 makes it possible for another PB 13 to read the value stored in the selected register 31r via the configurable routing matrix 15.

At a given clock cycle, a LOU (a combinational logic operation unit) 21 in a PB 13 carries out the combinational logic operation designated by the function data 24 of the configuration data 17 for the PB 13 on the input signal 23 obtained from the configurable routing matrix 15 and outputs the output signal 25. The output 25 is outputted or transmitted to the configurable routing matrix 15 via the direct output line 29. At the same time, the output (processing result) 25 of the LOU 21 is also sent to the storage unit 30 as data (register write data) to be written in a register. Typically, the output signal 25 is connected to a data input signal of every register 31r of the multi FF 31 inside the multi FF 31 as register write data.

Control over the register 31r into which the output signal 25 is written is carried out according to the write enable signals 19e that are supplied from the decoder 32, which serves as an storage input control unit, based on the storage control signals 19. That is, if the write enable signal 19t is invalid, all of the write enable signals 19e of the registers 31 are invalid, while if the write enable signal 19t is valid, one out of the write enable signals 19e of the registers 31 is valid and the output signal 25 is stored in the designated register.

When the present clock cycle ends, the value of the register 31r whose write enable signal 19e was valid in the multi-register 31 of each processing block 13 is updated. At the same time, the selection value 16 of the configuration designating register 12r is updated according to a write signal 20 for the configuration designating register 12r that has been generated by one of the PBs 13 and outputted to the configurable routing matrix 15. By doing so, the next configuration is decided. These processes are performed in one clock cycle in the device 10.

In the next clock cycle, one out of the configuration memory array 11 is selected in accordance with the selection value 16 of the configuration designating register 12r to determine the configuration data 17. The states of the PBs 13, the storage control unit 40, and the configurable routing matrix 15 are designated, and the processing proceed thereafter according to the same procedure as in the previous cycle. In this way, the operation procedure of the device 10 is the same in each cycle. On the other hand, it is possible to change the configuration data 17 that influences the operation result of the device 10 in each cycle, so that different processing can be carried out by the respective PBs 13 in each cycle.

Figure 4:
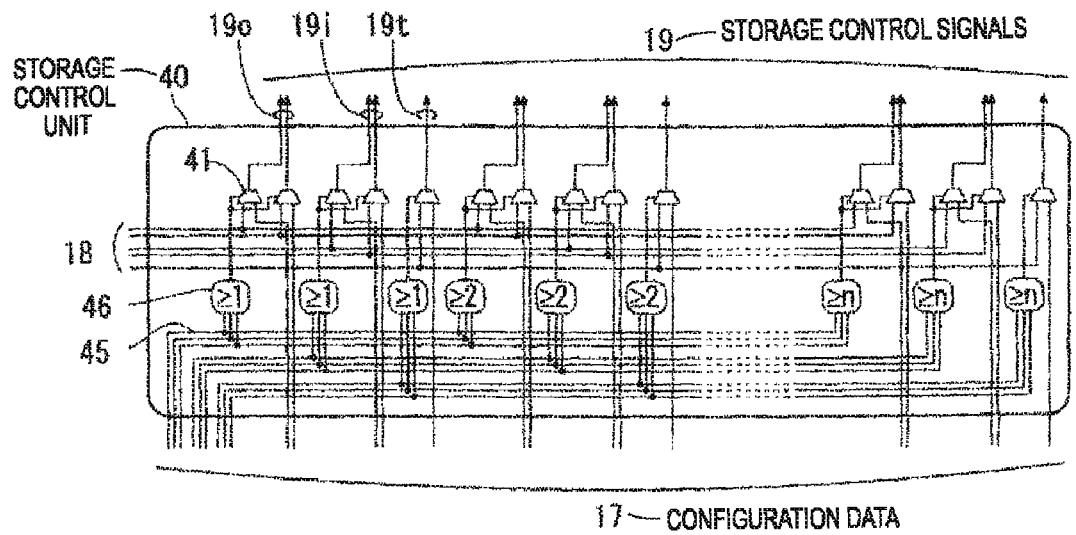
FIG. 4 is a block diagram showing one example of a storage control unit included in the device shown in FIG. 1.

FIG. 4 is a block diagram of the storage control unit 40. The storage control unit 40 includes a selector group 41. The selector group 41 selects the output control signal 19o (two bits), the input control signal 19i (two bits), and the write enable signal 19t (one bit) from a part out of the configuration data 17 according to the configuration data 17. The selector group 41 can also select the signals 19o, 19i, and 19t from input signals 18 obtained from the configurable routing matrix 15. The storage control unit 40 can also generate the control signals 19 for every PBs 13 independently. For the storage control unit 40 shown in FIG. 4, the input signals 18 supplied from the configurable routing matrix 15 to the unit 40 are common to the read select signal, the write selection signal, and the write enable signal for all of the PBs 13. By reducing the amount of configuration data 17 and the number of input signals 18 included in the configurable routing matrix 15, it is possible to avoid having silicon area consumed by data and/or the routing matrix.

For the storage control unit 40 shown in FIG. 4, information for controlling the selector 41 included in the configuration data 17 is supplied as a control signal 45. The control signal 45 is not separately provided for each PB 13 and by encoding a "number" in the control signal 45, the number of signal lines is reduced. For example, the control signal 45 includes a signal that shows "the number of PBs that select a signal 18 obtained from the configurable routing matrix 15 as the output control signal 19o". As a result, a comparator 46 provided corresponding to each PB compares the control signal 45 and its own PB number and supplies the control signal to the selector 41 corresponding to its own PB 13.

For example, if the control signal 45 is "0", all of the comparators 46 become "false". As a result, the storage control unit 40 is set so as to select a predetermined signal out of the configuration data 17 as the output control signal 19o, not a signal 18 obtained from the configurable routing matrix 15. If the control signal 45 is "2", the comparators 46 of the two PBs 13 on the left become "true". This means that in the storage control unit 40, the output control signal 19o of the two PBs 13 on the left is generated from the signals 18 obtained from the configurable routing matrix 15. The output control signal 19o of the remaining PBs 13 on the right is generated from predetermined signals in the configuration data 17. During the generation of the input control signal 19i and the write enable signal 19t, the storage control unit 40 is controlled in the same way based on or according to the configuration data 17.

The configuration of the storage control unit 40 shown in FIG. 4 is designed so as to reduce the silicon area required to implement the storage control unit 40 and to prevent the restrictions when user circuits are mapped onto the device from, being very strict in actual use. That is, it is expected that in many cases the selection of read/write registers will be directly designated by the configuration data 17. In such case, the storage control unit 40 carries out control based on the configuration data 17 to make it possible to read and write different registers 31r in each PB 13.

There are also cases where the selection of the registers 31r is to be made indirectly or dynamically based on the signals 18 obtained from the routing matrix 15. One example is a data path-type multibit operation. For a multibit operation, it is rarely necessary to read and write different registers 31r in each PB 13. This means that there is almost no demerit to sharing the signals 18 from the configurable routing matrix 15 between a plurality of PBs 13. However, it is thought that there are many possibilities for the number of bits in a multibit operation. It is effective to designate the number of PBs 13 via the configuration data 17.

When the storage control unit 40 is used to control a data path-type operation, the storage control unit 40 should preferably carry out control corresponding to the data path-type operation. In the device 10 shown in FIG. 1, shared control, (common control) is carried out over the entire device by the single storage control unit 40. In a device that mainly carries out data path-type operations, it is preferable to assign a storage control unit to each group of around ten or twenty PBs 13 and to carry out shared control (common control) over the PBs 13 included in such groups.

Next, an example of mapping a specific user circuit onto the device 10 will be described. FIG. 5 shows a user circuit 51 to be mapped that is expressed in Verilog codes. This user circuit functions as a state machine where four states (00), (01), (10), and (11) are executed according to the value of a state register.

Figure 6:
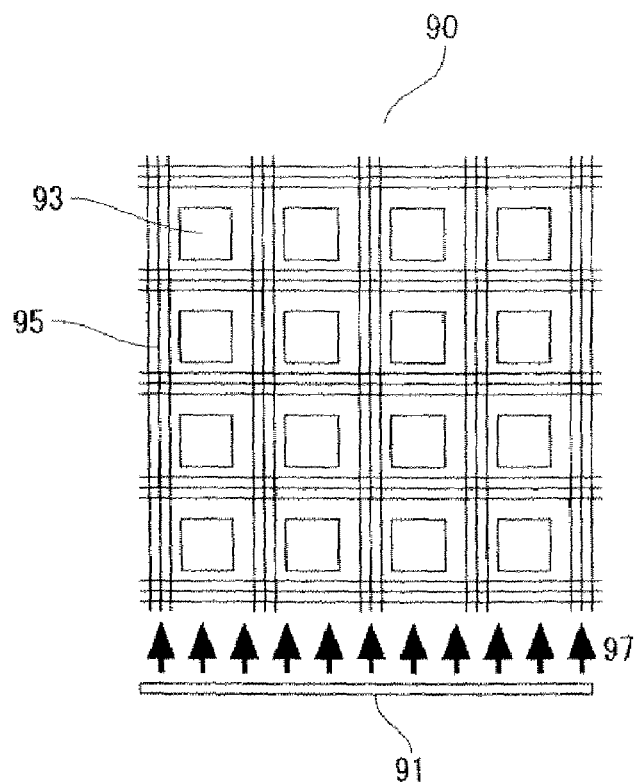
FIG. 6 shows one example of an FPGA.
Figure 7:
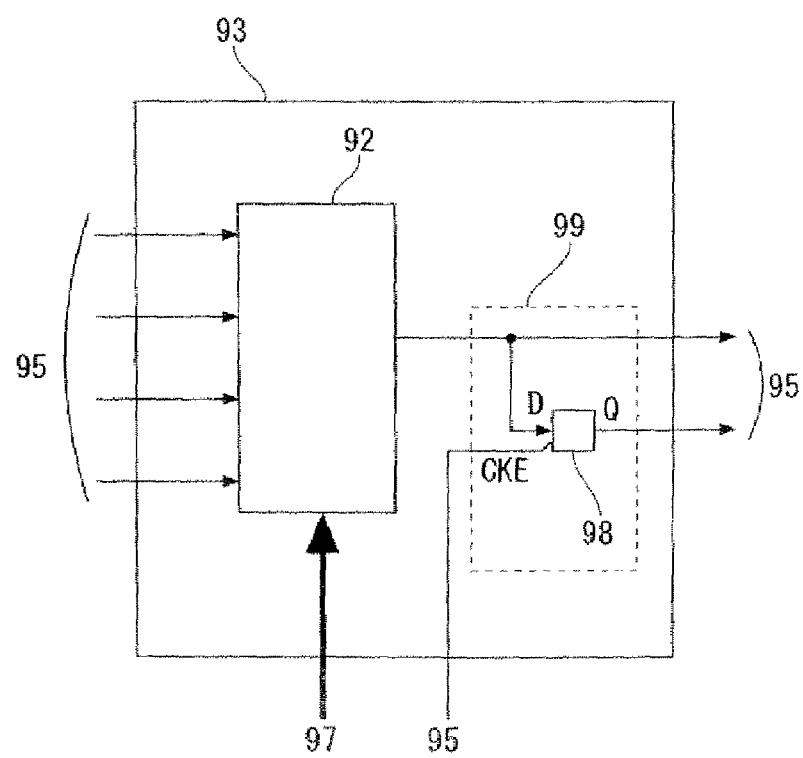
FIG. 7 shows one example of a processing block of the FPGA.

First, for a reference, an FPGA that can calculate an arbitrary four-input logic function is imagined and the case where the user circuit is configured in such FPGA is described. FIG. 6 shows a block diagram of this type of FPGA 90 and FIG. 7 shows a configuration of a processing block 93. The FPGA 90 is equipped with a plurality of processing blocks 93, a routing matrix 95 that connects the processing blocks 93, and a memory 91 in which data 97 for programming the processing blocks 93 and the routing matrix 95 is stored. Each processing block 93 is equipped with a logic operation unit 92 that can calculate an arbitrary four-input logic function and output unit 99 that outputs the result of the logic operation unit 92 to the routing matrix 95 either directly or after latching in a register 98.

Figure 8:
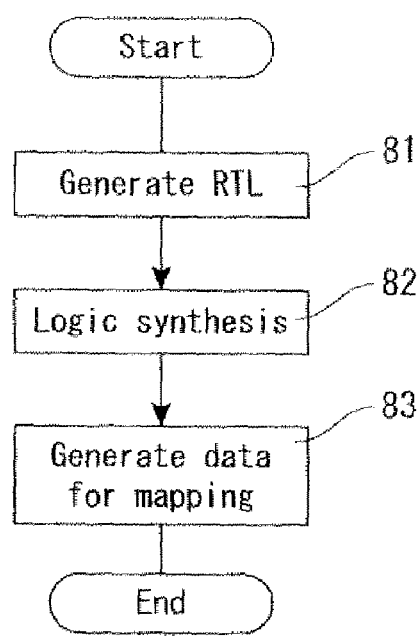
FIG. 8 shows a procedure that maps a user circuit onto the FPGA.

FIG. 8 shows a method of mapping the user circuit 51 onto the FPGA. In step 81, RTL (Register Transfer Level) descriptions in hardware language (Verilog, VHDL, or the like) are generated from behavioral level descriptions in C language or the like using a behavioral synthesis tool. In step 82, a circuit diagram is generated by a logic synthesis tool for the FPGA where the circuit is to be implemented. In step 83, data 97 for mapping onto the FPGA is generated by a place and route (layout/wiring) tool.

Figure 9:
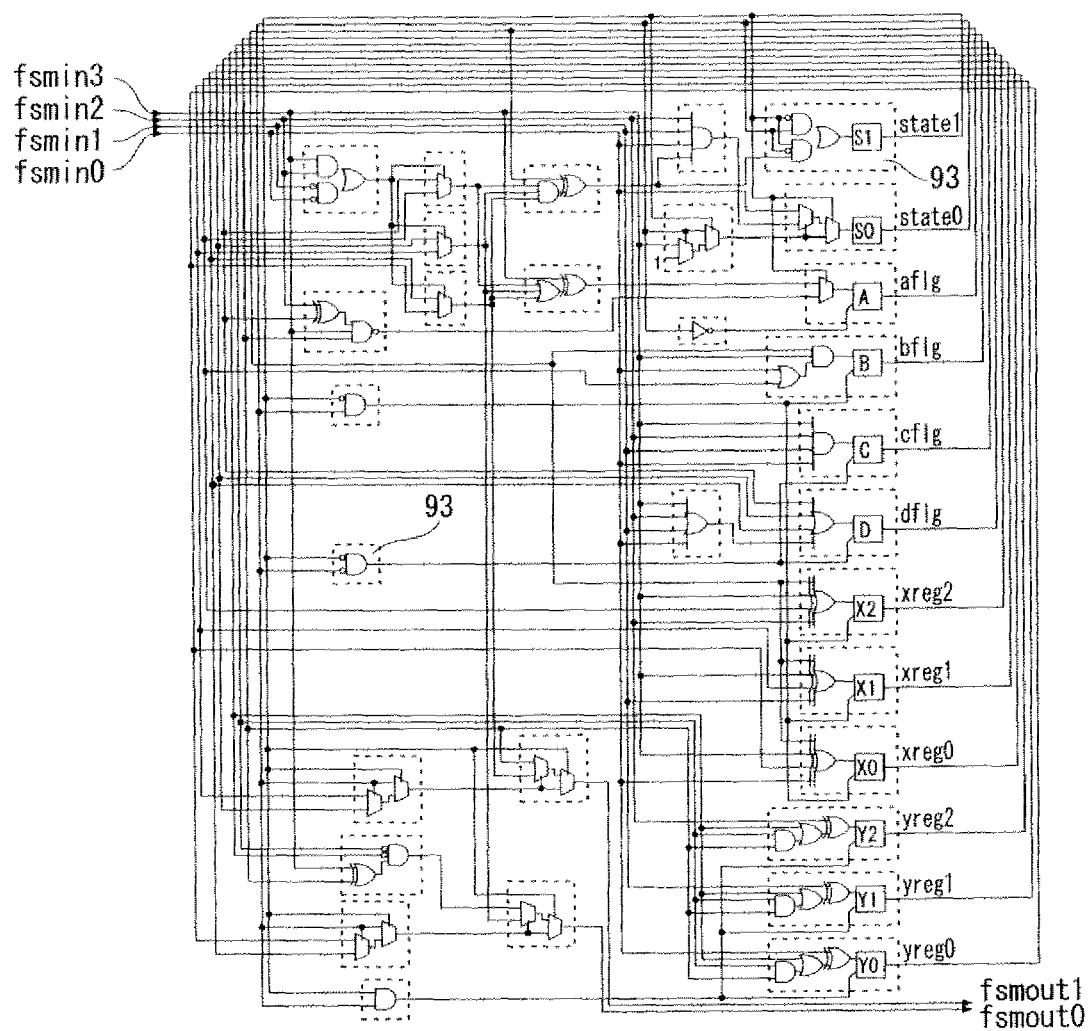
FIG. 9 is a circuit diagram produced by logic synthesis of a user circuit.
Figure 10:
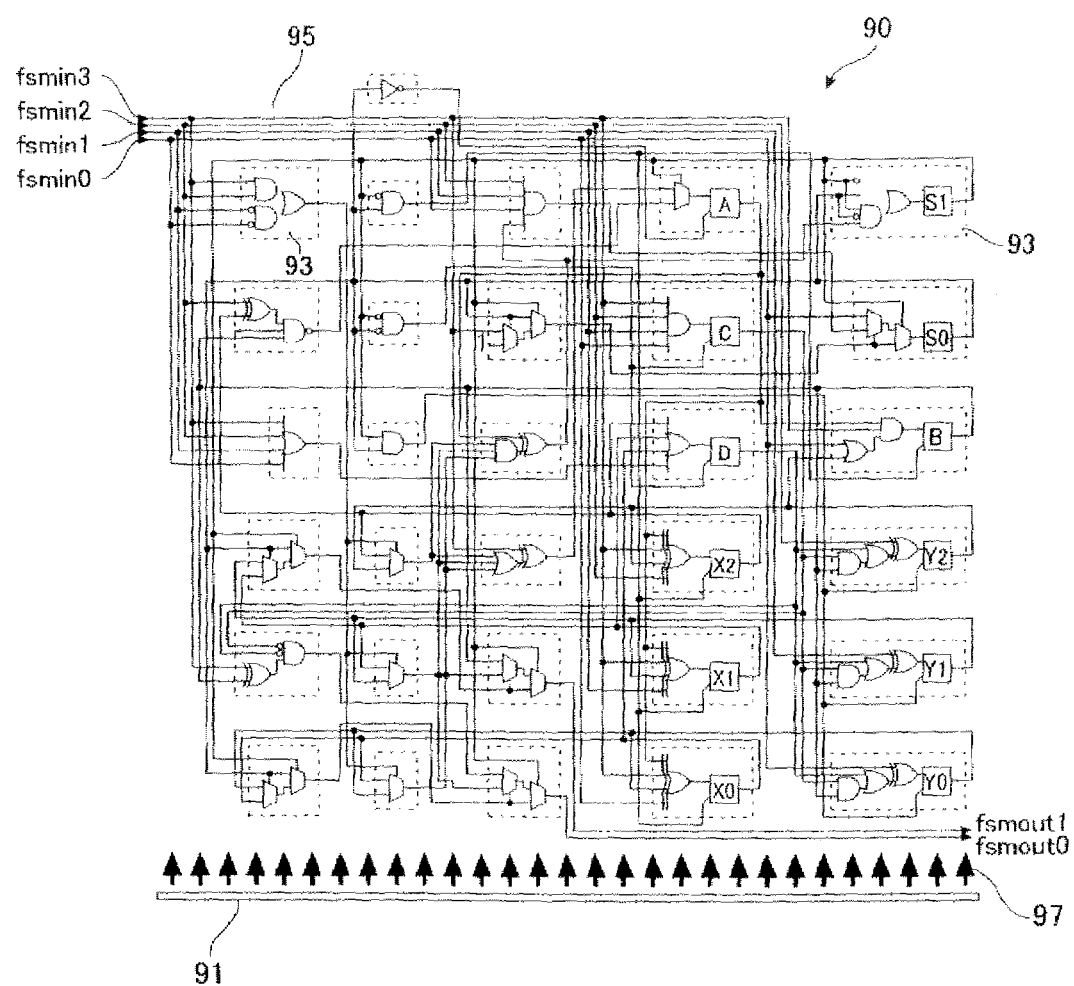
FIG. 10 shows how the circuit diagram is mapped onto the FPGA.

FIG. 9 is a circuit diagram produced by logic synthesis of the user circuit 51 expressed by the RTL description in FIG. 5 for mapping on the FPGA 90. FIG. 10 shows the result of mapping the circuit diagram shown in FIG. 9 onto the FPGA 90. As shown in FIG. 10, in the FPGA 90, the user circuit 51 is mapped or implemented using thirty-one processing blocks 93.

Figure 11:
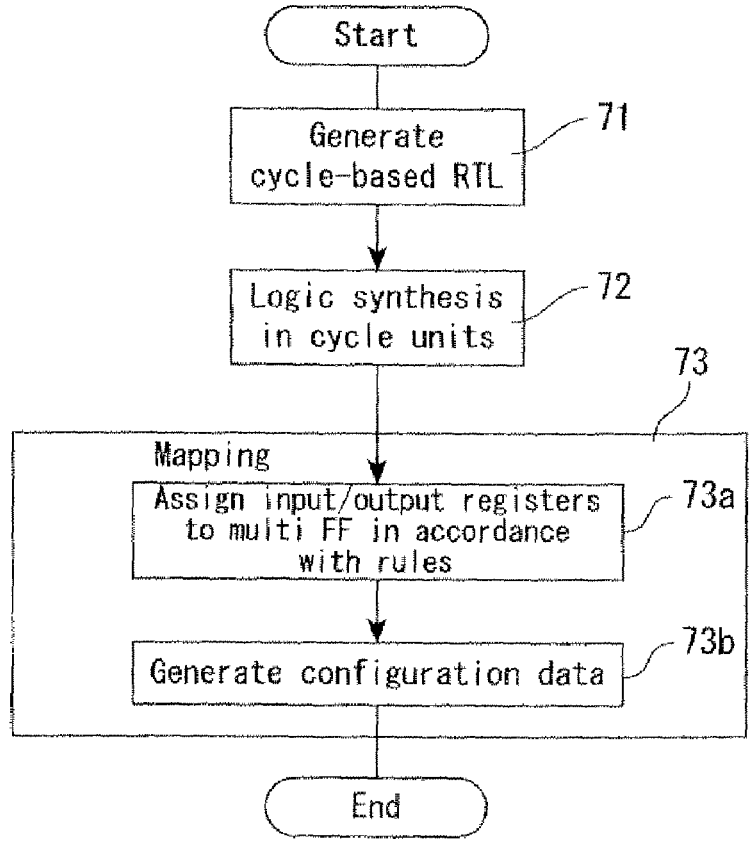
FIG. 11 is a flowchart showing a procedure that maps a user circuit onto a reconfigurable device.

FIG. 11 is a flowchart showing a process that maps the user circuit onto the device 10 of the present embodiment. First, in step 71, the behavioral level description written in C language or the like is analyzed and cycle-based RTL descriptions where operations are described in cycle units are generated. The user circuit 51 to be mapped is a state machine. Accordingly, by setting one state as the processing in one cycle, the RTL descriptions shown in FIG. 5 corresponds to cycle-based RTL descriptions. In step 72, logic synthesis is carried out for the cycle-based RTL descriptions to generate the circuit diagrams in each cycle. In step 73, the configuration data 17 for mapping the circuit onto the device 10 in each cycle is generated. The configuration data 17 can therefore be described as groups of configuration data for each cycle.

In step 73 that generates the configuration data 17, the individual PBs 13 may not be assigned to different registers respectively included in the user circuit 51, that is, the input registers (i.e., registers in which input data is stored) and output registers (i.e., registers in which output data is stored). In step 73*a*, different FF (registers) 31*r* in the multi FF 31 of the storage units 30 are assigned according to rules to the respective input registers (registers that are read) and output registers (registers that are written).

In addition, circuits that would be assigned to a plurality of processing blocks of the FPGA, are merged and mapped onto a single PB 13 in the device 10. In step 73*b*, the configuration data 17 for mapping the merged circuit onto a single PB 13 is generated. When the input and output registers are the same, the same register 31*r* in the multi FF 31 is assigned.

The rules in step 73*a* include referring to the input/output state of the present cycle and the input/output states of other cycles and assigning the input and output registers to different registers 31*r* of the multi FF 31 within a range covered by the functions of the storage unit 30. For example, in the storage unit 30 shown in FIG. 2, in one cycle, it is possible to write into only one out of the four registers 31*r* of the multi-register 31. Independently of such writing, the storage unit 30 can output data from one of the registers 31*r* of the multi-register 31. Accordingly, it is necessary to map or assign registers that are simultaneously referred to in a given cycle to different PBs 13. It is also necessary to map or assign registers whose values are simultaneously updated in a given cycle to different PBs 13.

In accordance with such rules, in step 73*a*, the registers that are referred to in the circuits are assigned to one of the multi-registers 31 of the storage unit 30. Also, within such rules, functions that require a plurality of processing blocks during the logic synthesis stage of step 72 are merged in a single PB 13. In one example of the storage units described later, all the outputs of the four registers 31*r* that construct a multi-register 31 are referred to from the routing matrix 15. When generating configuration data for mapping onto a device that includes such type of storage units, there is the possibility of generating configuration data for mapping even registers that are simultaneously referred to in a given cycle onto a single PB 13.

Figure 12:
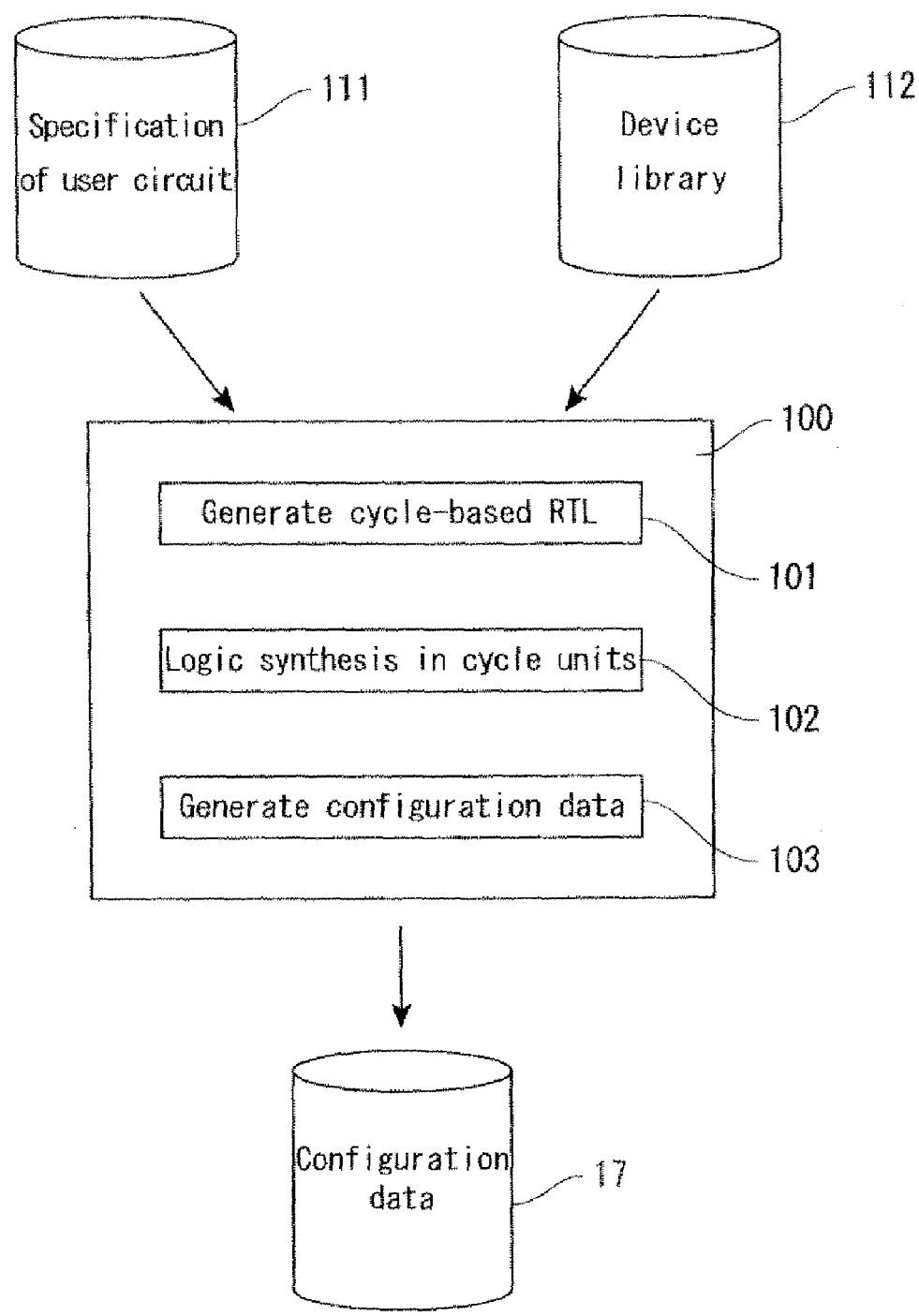
FIG. 12 is a block diagram showing a system that generates configuration data.

FIG. 12 is a block diagram of a system that generates configuration data based on the above mapping method. This system 100 is provided as software (i.e., a program product) for controlling a standard computer by being recorded on a suitable recording medium, such as a CD-ROM. The system 100 is configured with the hardware resources of the computer. This system 100 is provided as part of a CAD system or framework that develops and designs a reconfigurable device 10 in the same way as a CAD system for developing and designing semiconductor devices such as LSIs or ASICs. The system 100 includes a generator means 101 that reads data 111 that relates to the specification of the user circuit 51 and generates a cycle-based RTL descriptions of the user circuit, a logic synthesis means that carries out logic synthesis on the cycle-based RTL descriptions in each cycle, and a generator means 103 that generates the configuration data 17 based on the result of the logic synthesis and information in a device library 112. The generator means 103 of the configuration data generates configuration data 17 for, when mapping the cycle-based circuits that have been generated by logic synthesis onto a plurality of PBs 13, assigning different registers of inputting and/or outputting that are included in the cycle-based circuits to the different storage elements (registers) 31*r* included in the plurality of storage elements (multi FF) 31 of the storage unit 30 in accordance with the rules described above. The generated configuration data 17 is a collection of configuration data for each cycle.

By generating the configuration data 17 in this way, it is possible to assign registers that store a plurality of pieces of data that are inputted and outputted in a given cycle to the multi FF 31 of a single PB 13, and to assign registers that store a plurality of pieces of data that are inputted and outputted across cycles to the multi FF 31 of a single PB 13. Accordingly, by using the mapping method described earlier and the generating the configuration data 17 based on such method, it is possible to greatly increase the usage efficiency of the PBs 13. A user circuit can be implemented using fewer hardware resources. Since it is also possible to prevent insufficiencies in hardware resources from occurring, it is also easy to raise the parallelism and improve the processing speed.

The increase in usage efficiency of the PB 13 can be described from a number of aspects. A first aspect is that the output of the logic operating unit 21 is latched in the multi FF 31 of the storage unit 30. It becomes possible to separate the timing at which the output 25 is required from the timing at which the logic operation is performed. In addition, after the operation, the logic operation unit 21 of the PB 13 is released from the logic of making the output 25 and the logic operation unit 21 can proceed to the next logic operation.

Another aspect is that both of the operation logic of the logic operation 21 and the selections of the multi FF 31 are controlled by the configuration data 17. This means that for the functions of a PB 13, the logic operations and outputs can be separately controlled by the configuration data 17 by using the multi FF 31, and it will definitely be possible to change the logic operation unit 21 of each PB 13 in each set of configuration data that is changeable or variable in cycle units in the present embodiment separately from the timing of outputs required. In addition, the PB 13 is equipped with the direct output line 29. According to a set of the configuration data 17 supplied at one cycle, it is possible to output a plurality of logic operation results from a single PB 13 without raising the clock frequency.

Yet another aspect is that it is possible to latch the operation result of the logic operation unit 21 in the multi FF 31 and output the result in a following cycle. When plurality sets of input data are required for the logic to be performed at a given cycle, the plurality sets of input data can be prepared in advance across a number of cycles. In addition, it is possible to average out momentary increases in the number of operations across the time axis. The content and timing of a logic operation in each PB 13 and the content and timing of the output of each PB 13 are all resolved in the configuration data 17 for mapping a circuit onto the device 10. It may not be necessary to raise the clock frequency, to add a function for synchronizing circuits with different clock frequencies, or to provide a special memory.

Figure 13:
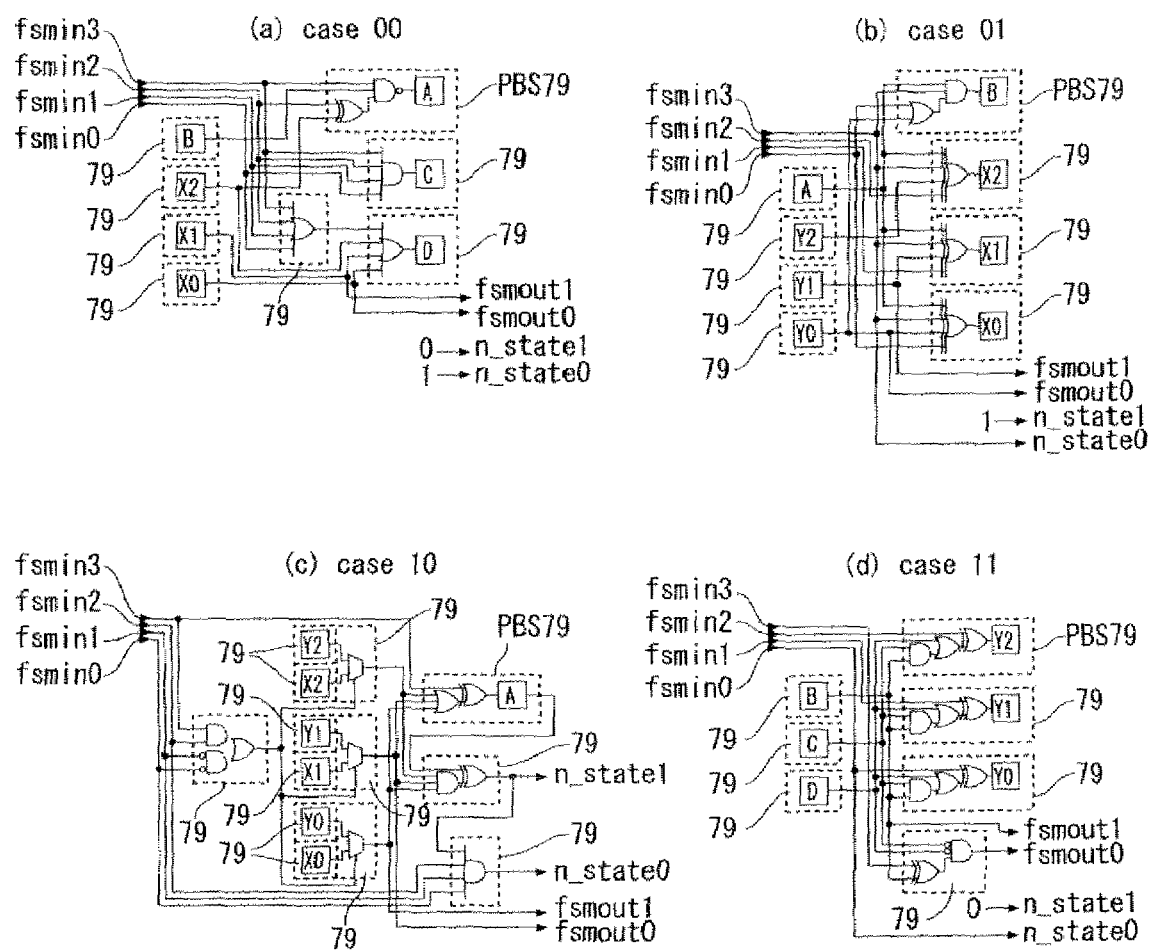
FIG. 13 shows how circuits, which have been produced by logic synthesis of a user circuit in cycle units, are mapped onto processing blocks (PBS) with a single register, where

FIGS. 13 (a) to 13 (d) show the results of logic synthesis in each state, i.e., in each cycle, for mapping the user circuit 51 expressed by the Verilog code shown in FIG. 5 onto the device 10. That is, FIG. 13 shows the output of step 71 in FIG. 11. The circuit diagrams resulting from the logic synthesis are the four cases in FIGS. 13(a) to (d) for cycles.

FIG. 13(a) is a circuit diagram for the state (00). A small-scale logic operations are carried out based on the present value of a bflg register (B), the present values of xreg registers (X0, X1, X2) and fsmin input signals (fsmin0, fsmin1, fsmin2, fsmin3), and values are written in an aflg register (A), a cflg register (C), and dflg register (D). In addition, values of xreg registers (X0, X1) are outputted to fsmout output signals (fsmout0, fsmout1). A constant (01) is outputted as an n_state signal (n_state0, n_state1) for designating the next configuration. According to the n_state signal, a transition to the state (01) in the next cycle is designated.

FIG. 13(b) is a circuit diagram for the state (01). FIG. 13(c) is a circuit diagram for the state (10). FIG. 13(d) is a circuit diagram for the state (11). These circuits are produced by translating the states into individual circuit diagrams in keeping with the case statements in the Verilog code shown in FIG. 5. Note that in FIGS. 13(a) to (d), a processing block PBS 79 where the output of a logic operation unit is latched using a single FF is imagined and the logic is divided up using broken lines. At the logic synthesis stage, the user circuit 51 is mapped onto a device including processing blocks PBSs 79 with single FF, and eight PBSs 79 are required to implement the state (00) and eight PBSs 79 are required to implement the state (01). In the same way, thirteen PBSs 79 are required to implement the state (10) and seven PBS 79 are required to implement the state (11). At the stage where logic synthesis has been carried out, the user circuit 51 can be mapped using a maximum of thirteen PBS 79. In the FPGA as shown in FIG. 10, thirty-one processing blocks are required for mapped the same user circuit 51.

Figure 14:
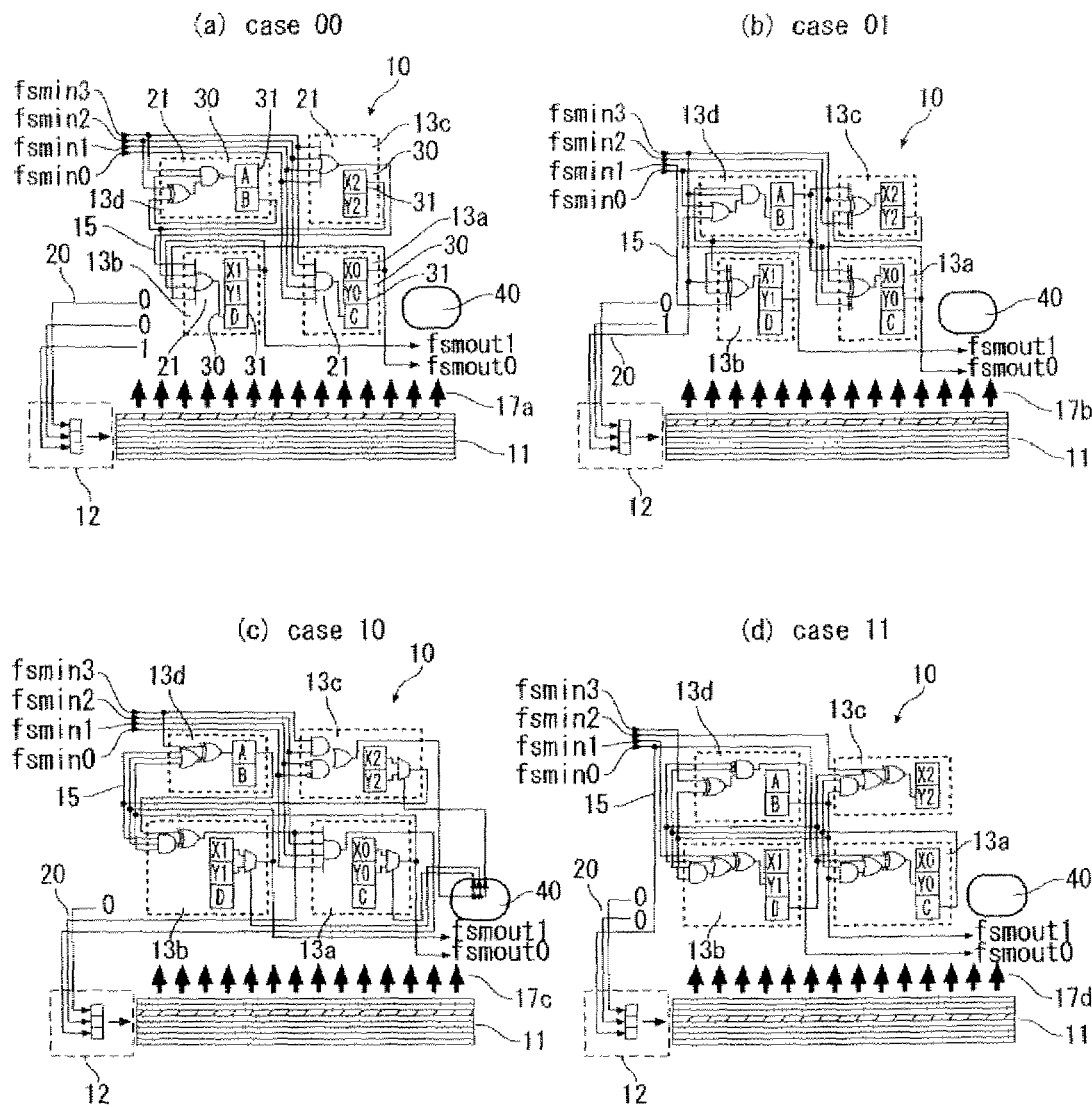
FIG. 14 shows an example of where a user circuit has been mapped onto a device that includes a multi FF, where

FIGS. 14 (a) to 14 (d) show the results of mapping the circuits produced by logic synthesis in each cycle onto the device 10. These circuits are the output of step 73 in FIG. 11. FIG. 14(a) shows mapping of the state (00), FIG. 14(b) shows mapping of the state (01), FIG. 14(c) shows mapping of the state (10), and FIG. 14(d) shows mapping of the state (00).

In any of the states (cycles), the user circuit is mapped using four PBs 13. Accordingly, it can be understood that by reconfiguring the device 10 in cycle units, it is possible to map the user circuit 51 using four PBs 13. This user circuit 51 is the same as a circuit that uses thirty-one processing blocks for mapping in the FPGA shown, in FIG. 10.

Figure 15:
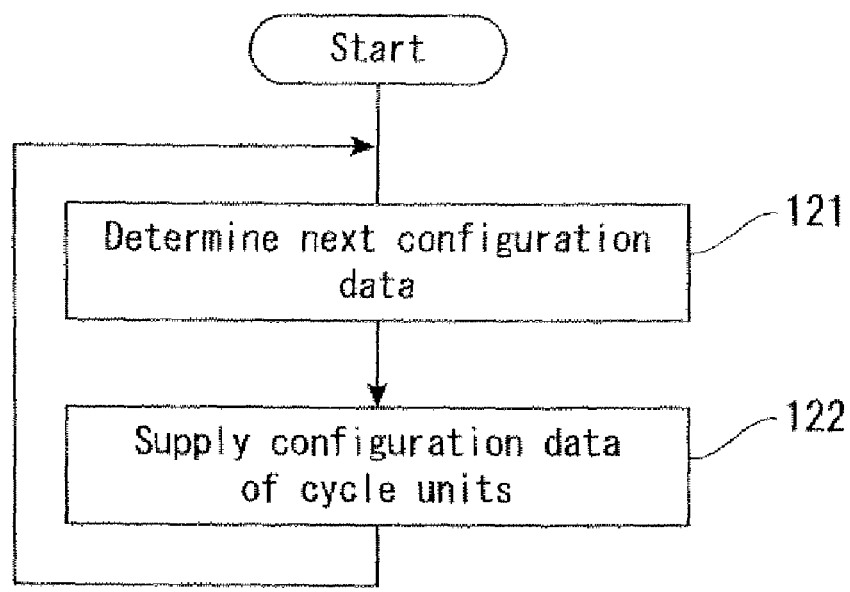
FIG. 15 is a flowchart showing control of a device according to configuration data.

FIG. 15 shows control of the device 10. In this device 10, the next configuration data to be supplied next to the processing blocks is determined in step 121. In step 122, by supplying one of the configuration data 17a to 17d for the respective cycles from the configuration memory 11 to the PBs 13, the respective functions in each state (cycle) in the RTL descriptions of the user circuit 51 are realized. The configuration data (the sets of configuration data) 17a to 17d for respective cycle supplied in cycle units to the PBs 13 are determined by the selection value 16 of the configuration control unit 12 based on the signal 20 outputted from the PBs 13. Accordingly, in the device 10, the configuration in the following cycle (i.e., the "next configuration") is determined in each cycle and the device is reconfigured with the next configuration, thereby changing the content of the processing by the device in cycle units.

In step 122, when mapping cycle-based circuits onto a plurality of processing blocks PB, different registers for inputting and/or outputting that are included in the cycle-based circuits are assigned to the registers 31r of the multi FF 31 based on the configuration data in each cycle. The device 10 shown in FIG. 1 is equipped with the configuration control unit 12 for controlling the plurality of PBs. The configuration control unit 12 controls the logic of the plurality of the processing blocks PB that makes units of sections or groups. Since the configuration is determined in units of sections or groups composed of the plurality of the processing blocks PB, it is easy to adjust the interface by reconfiguring the routing matrix 15.

It is possible to include a control function for determining the next configuration in each processing block PB. In this case, the write signal 20 supplied from a PB 13 to the control unit 12 via the routing matrix 15 is designation information for the next configuration outputted from the PB 13. In this method, the configurations of the processing blocks can be controlled in units of the processing blocks PB, that is, units of the configuration data correspond to the processing blocks. In this method, a variety of configurations can be more flexibly realized. On the other hand, there is a tendency for an increase in the hardware resources required to control the configuration and the possibility that it wilt be necessary to adjust the interface between, adjacent processing blocks, i.e., to resolve the configurable routing matrix 15 by each set of configuration data.

In step 73a in FIG. 11 for generating the configuration data of the user circuit 51, the input/output state for the registers in each cycle and the input/output state for other cycles are determined. More specifically, in step 73a, based on a rule stating that the storage unit 30 is capable of one input and one output for the multi FF 31 in each cycle, configuration data 17 for assigning the plurality of registers per cycle included in the cycle-based circuits produced by logic synthesis to the registers 31r of the multi FF 31 of the PB 13 is generated as follows.

State 00:

Since registers X0 to X2 and register B are read, such registers need to be assigned to the multi FF 31 of different PBs 13.

Since register A, register C, and register D are written, such registers need to be assigned to the multi FF 31 of different PBs 13.

State 01:

Since registers Y0 to Y2 and register A are read, such registers need to be assigned to the multi FF 31 of different PBs 13.

Since registers X0 to X2 and register B are written, such registers need to be assigned to the multi FF 31 of different PBs 13.

State 10:

Since registers X0 and Y0, registers X1 and Y1, and registers X2 and Y2 are dynamically selected and read, such pairs of registers need to be assigned to the multi FF 31 of different PBs 13, In addition, since register A is read, such register needs to be assigned to the multi FF 31 of a different PB 13 to the pairs mentioned above.

Since registers X0 to X2 and register B are written, such registers need to be assigned to the multi FF 31 of different PBs 13.

State 11:

Since register B, register C, and register D are read, such registers need to be assigned to the multi FF 31 of different PBs 13.

Since register Y0 to Y2 are written, such registers need to be assigned to the multi FF 31 of different PBs 13.

The mapping shown in FIGS. 14(a) to 14(d) is one example where registers are disposed in the multi FF 31 of the four PBs 13 to satisfy the above conditions during the respective states. In this example, out of the four PBs 13, the register X0, the register Y0, and the register C are assigned to the multi FF 31 of the first PB 13a, with the remaining register being unused. The register X1, the register Y1, and the register D are assigned to the multi FF 31 of the second PB 13b, with the remaining register being unused. The register X2 and the register Y2 are assigned to the multi FF 31 of the third PB 13c, with the remaining two registers being unused. The register A and the register B are assigned to the multi FF 31 of the fourth PB 13d, with the remaining two registers being unused. Note that the layout of the four PB 13a to 13d can be freely selected so long as the blocks can be connected via the routing matrix 15, and the layouts shown in FIGS. 14(a) to 14(d) are merely one example. In FIG. 14(a), FIG. 14(b), and FIG. 14(d), the construction of the storage control unit 40 that controls the storage units 30 of the respective PB 13 is omitted.

Figure 16:
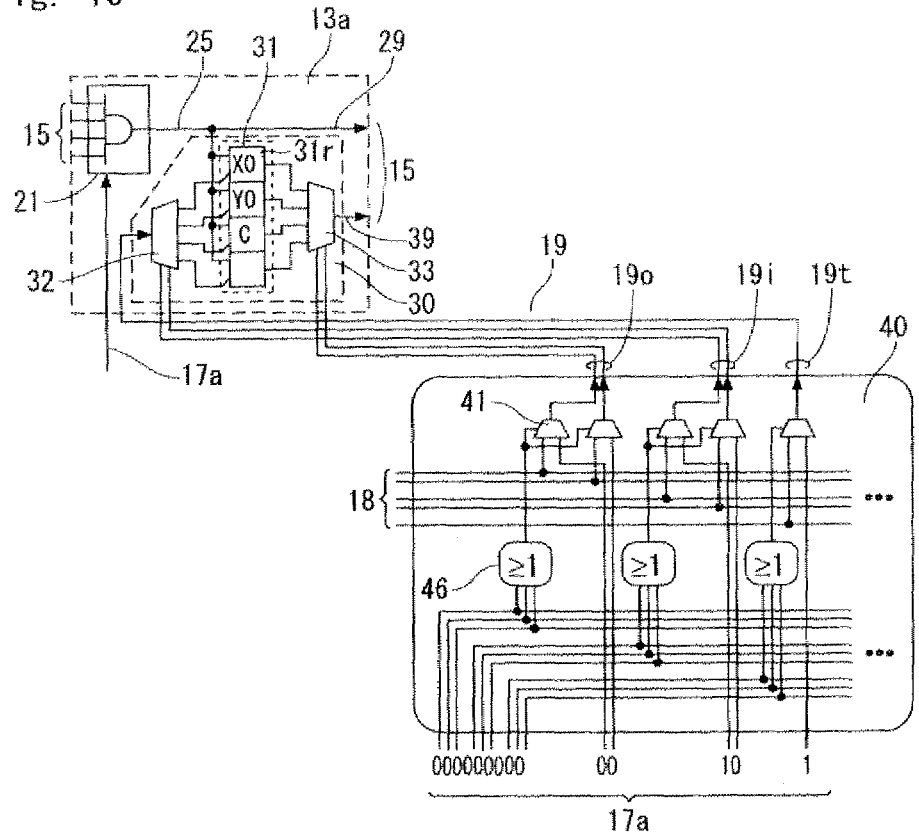
FIG. 16 is a diagram showing one example of a part relating to storage control of the configuration data.

FIG. 16 shows the operation of the storage control unit 40 for controlling the storage unit 30 of the PB 13a in state (00) shown in FIG. 14(a). Out of the parts of the configuration data 17a that control the storage control unit 40 in the state (00), the parts that control the selector 41 of the storage control unit 40 are all "000", so that the control signals 19 are all supplied from the configuration data 17a. The write enable signal 19t is "1", so that a write to one of the registers 31r of the multi FF 31 is permitted. The input control signal 19i is "10", so that a write into the second register 31r of the multi FF 31 assigned to the register C is selected. Since the output control signal 19o is "00", a read of the 0th register 31r of the multi FF assigned to the register X0 is selected. According to the storage control signals 19, the state of the storage unit 30 of the first PB 13a is set as shown in FIG. 14(a). The storage units 30 of the other PBs 13 are controlled in the same way by the configuration data 17a via the storage control signals 19.

Figure 17:
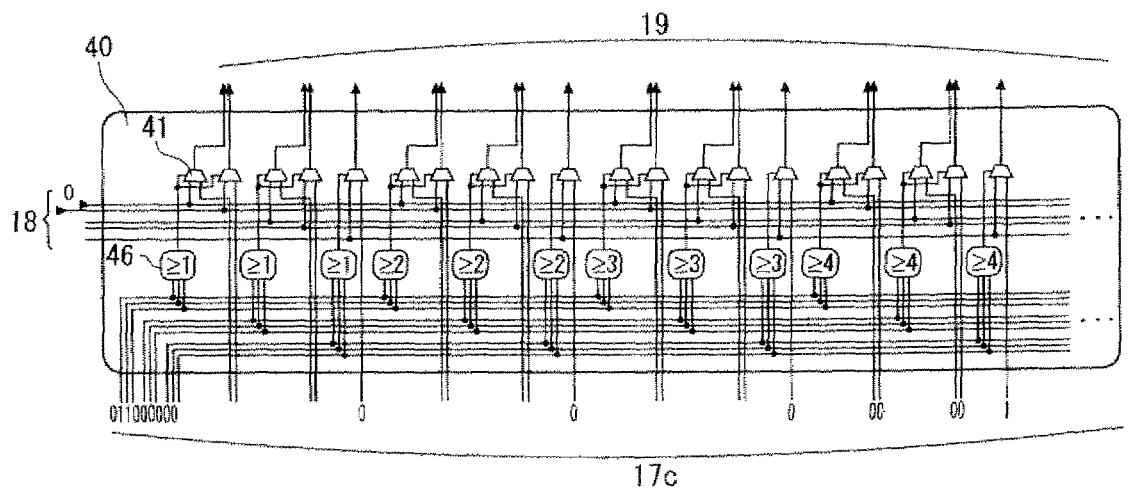
FIG. 17 is a diagram showing a different example of a part relating to storage control of the configuration data.

FIG. 17 shows the operation of the storage control unit 40 for controlling the storage units 30 of the PB 13a to 13d in the state (10) shown in FIG. 14(c). Out of the parts of the configuration data 17c that control the storage control unit 40 in the state (10), among the parts that control the selector 41 of the storage control unit 40, the part that controls reads is "011" and the other parts are "000". Accordingly, the storage control signal 19o relating to control of the read register of the multi FF 31 of the storage units 30 of the first to third PBs 13a to 13c is determined by the selection signal 18 supplied from the routing matrix 15 and the other storage control signals 19i and 19t are supplied from the configuration data 17c. This means that registers to be read from the respective multi FF 31 of the PBs 13a to 13c are determined according to a logic processing result of the logic operation unit 21 of the PB 13c. The register read from the PB 13d is determined according to the configuration data 17c, so that the 0th register of the multi FF 31 that is assigned to the register A is read. Regarding writes to the PBs 13a to 13c, since the data of the write enable signal of the configuration data 17c is all "0", the input selection signal part is "don't care". Regarding a write to the PB 13d, since the enable signal 19t is "1" and the input control signal 19i is "00", the output 25 of the logic operation unit 21 is written into the 0th register assigned to the register A of the multi FF 31.

Figure 18:
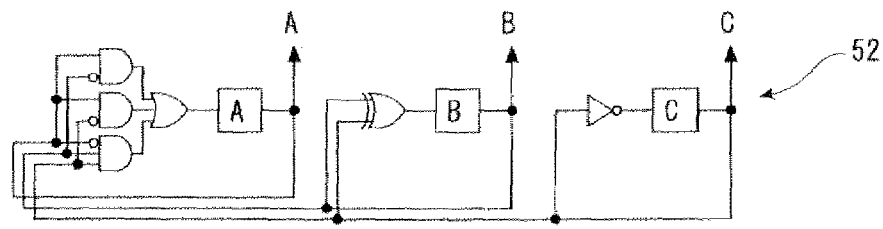
FIG. 18 is a diagram showing a different example of a user circuit.
Figure 19:
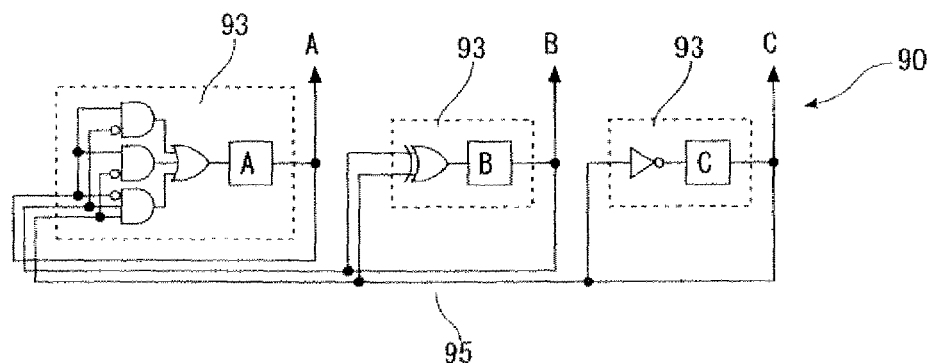
FIG. 19 is a diagram showing one example of where the user circuit shown in FIG. 18 is mapped onto an FPGA.
Figure 20:
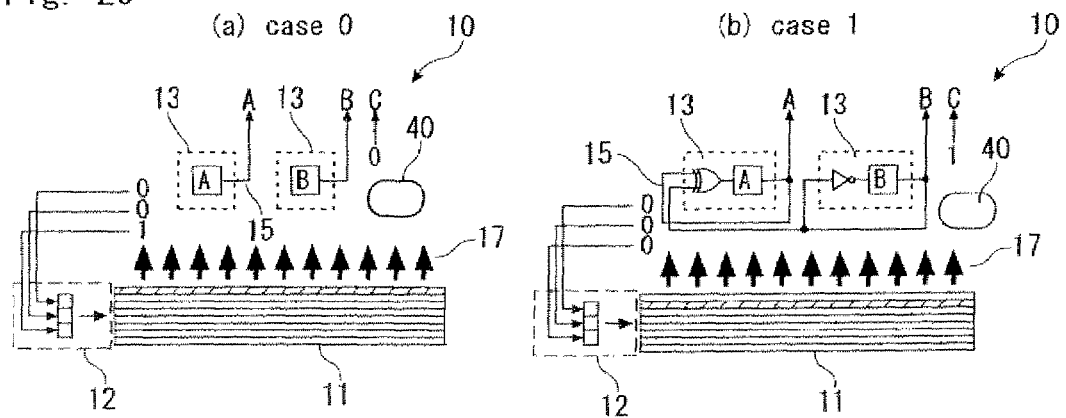
FIG. 20 shows one example of where the user circuit shown in FIG. 18 is mapped onto an FPGA, where
Figure 21:
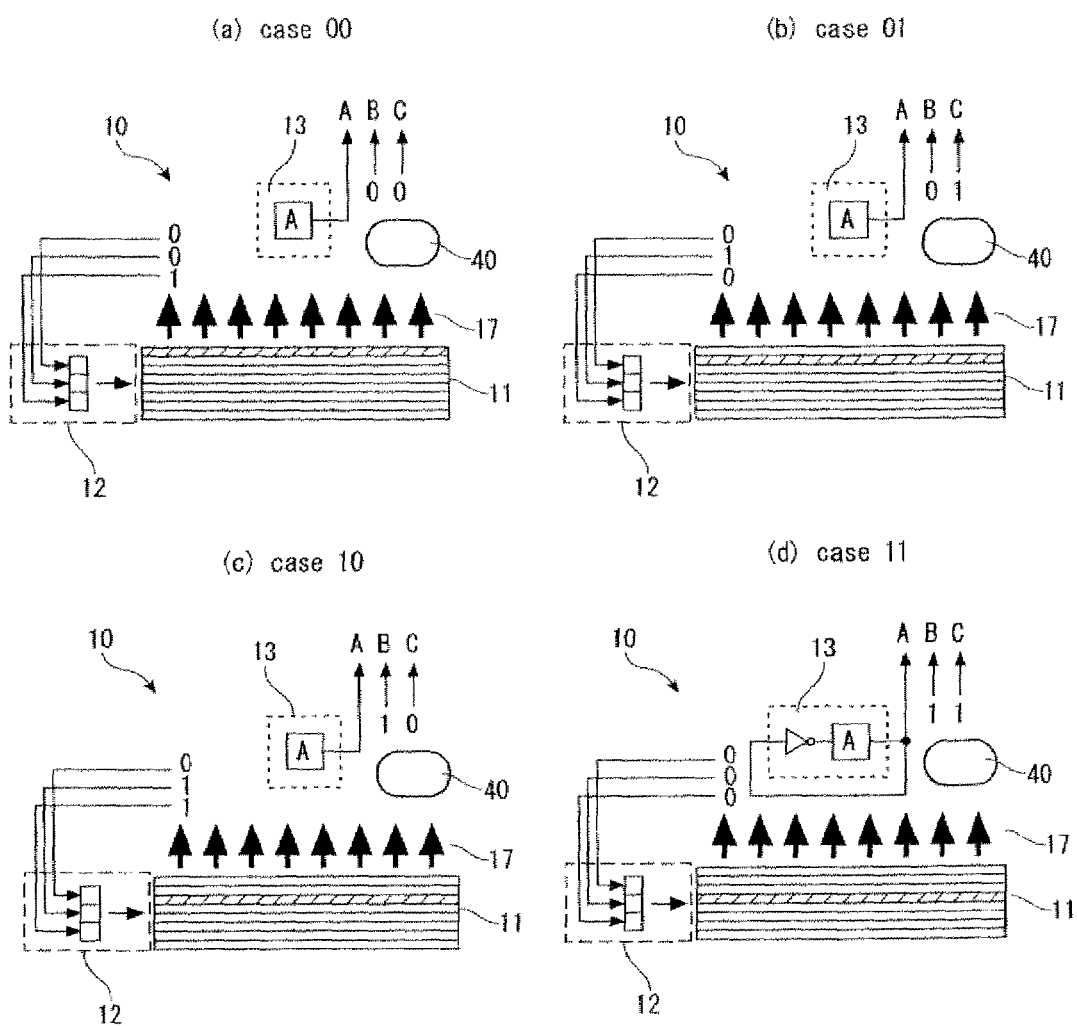
FIG. 21 shows a different example of where the user circuit shown in FIG. 18 is mapped onto a reconfigurable device, where

FIGS. 18 to 21 show an example where a different user circuit is mapped to the device 10 according to the present embodiment. The user circuit 52 shown in FIG. 18 is a three-bit counter. FIG. 19 shows mapping the user circuit 52 onto the FPGA 90 that is shown in FIG. 6. FIG. 20 shows an example where the user circuit 52 has been mapped onto the device 10 using two PB 13 and two sets (i.e., two cycles) of configuration data 17. FIG. 21 shows an example where the circuit has been mapped onto the device 10 using one PB 13 and four sets (i.e., four cycles) of configuration data 17. In these examples, the user circuit 52 that is a counter is regarded as a two-state or a four-state machine and the user circuit 52 is realized by mapping the operations of the respective states onto the device 10 on a cycle basis. As a result, it is possible to map the user circuit using a smaller number of processing blocks than when mapping onto the FPGA 90.

Aside from state machines, when most data path processing circuits are implemented in an actual system, such circuits are combined with registers. Accordingly, if combinations of data path processing circuits and registers are regarded as state machines, almost all data path processing circuits can be effectively mapped onto the device 10.

Figure 22:
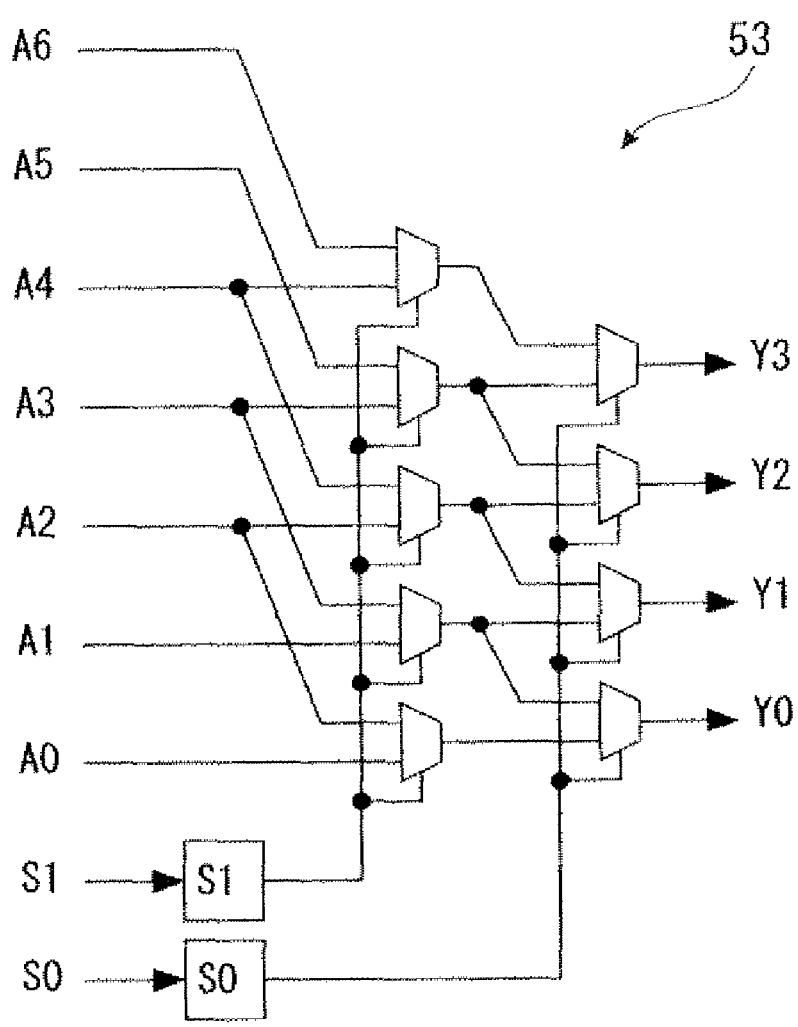
FIG. 22 shows a different example of a user circuit.
Figure 23:
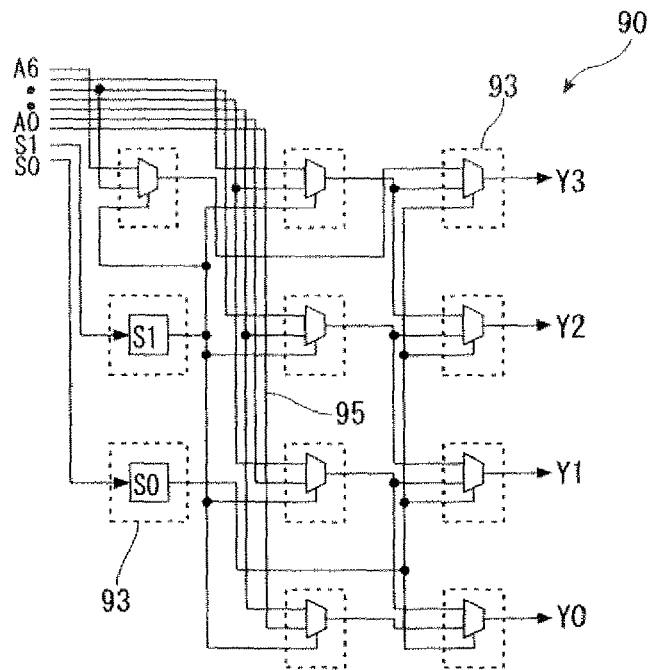
FIG. 23 shows one example of where the user circuit shown in FIG. 22 is mapped onto an FPGA.
Figure 24:
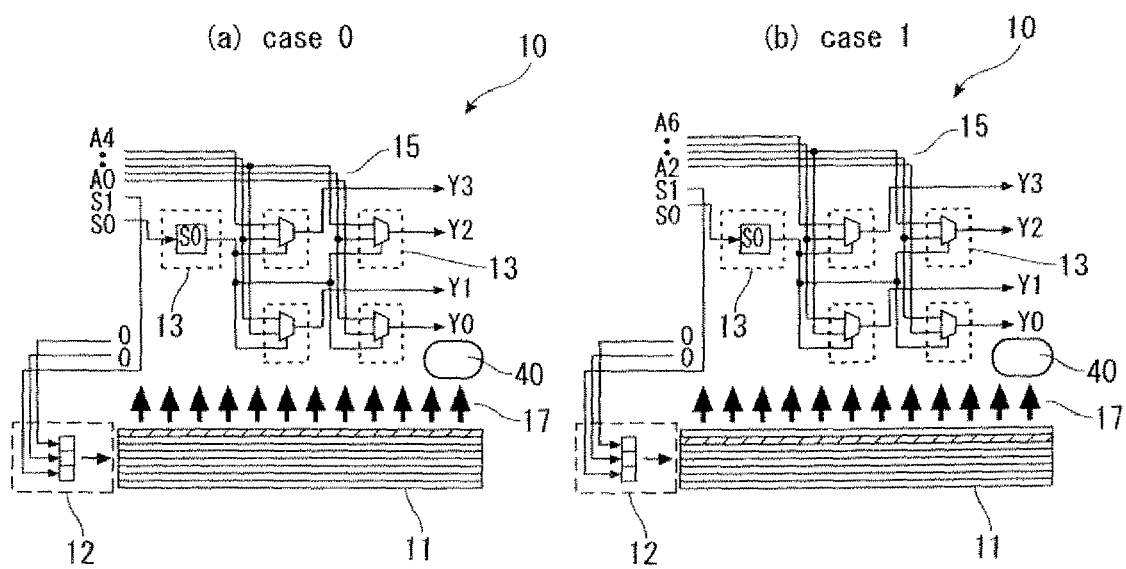
FIG. 24 shows one example of where the user circuit shown in FIG. 22 is mapped onto a reconfigurable device, where

FIGS. 22 to 24 show examples where other user circuits have been mapped onto the device 10. The user circuit 53 shown in FIG. 22 is a barrel shifter circuit that outputs a four-bit answer (Y3 to Y0) by shifting a seven-bit input A6 to A0 by a two-bit shift amount S1 and S0, and is a circuit where pipeline registers are combined with the shift amount S1 and S0. FIG. 23 shows the state where the user circuit 53 has been mapped onto the FPGA 90 shown in FIG. 6. FIGS. 24(a) and 24(b) show examples where the user circuit 53 has been mapped onto the device 10 of the present embodiment using five PB 13 and two sets (i.e., two cycles) of configuration data 17. In this case, the user circuit can be implemented in the device 10 using half the number processing blocks compared to the FPGA 90 or even fewer.

Figure 25:
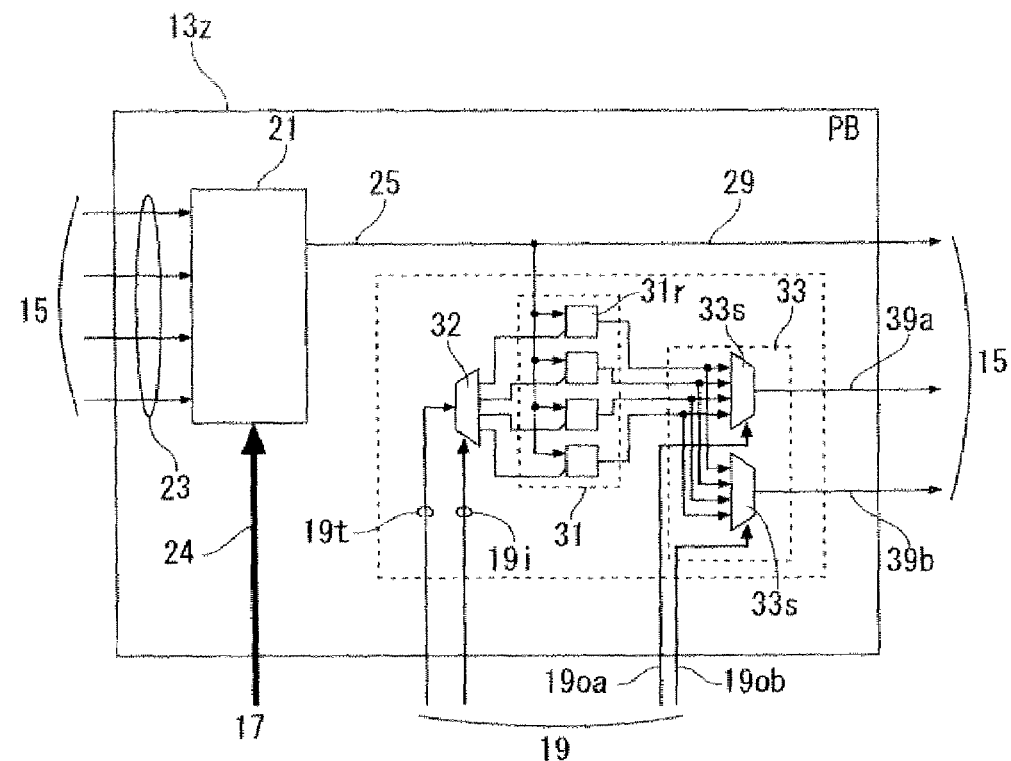
FIG. 25 is a block diagram showing a different example of a processing block.

FIGS. 25 to 31 show a number of modifications to the processing blocks PB. The output unit 33 of the storage unit 30 of the PB13z shown in FIG. 25 is equipped with two selectors 33s that each select one of the registers 31r of the multi FF 31 and output to (connect them to) the routing matrix 15. These two selectors 33s are controlled by two different output control signals 19oa and 19ob and the respective values selected are outputted as outputs 39a and 39b. Accordingly, out of the four internal registers 31r that construct the multi FF of the storage unit 30, two present values can be outputted to the routing matrix 15. This means that it is possible for another PB or other PBs to read two registers 31r of the multi FF 31 in the same cycle.

Figure 26:
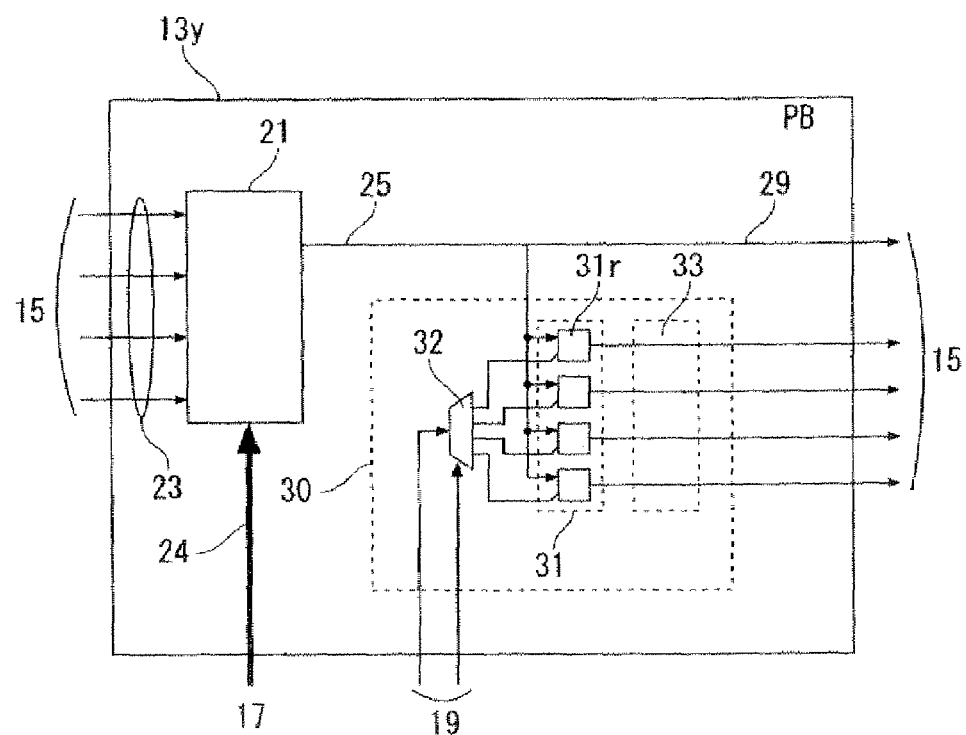
FIG. 26 is a block diagram showing yet another example of a processing block.

The storage unit 30 of the PB 13y shown in FIG. 26 is equipped with an output unit 33 that outputs all of the present values of the four internal, registers 31r that construct the multi FF 31 to the routing matrix 15. Accordingly, the output unit 33 of the storage unit 30 does not include a selector. The output control signal 19t is also unnecessary. Another PB or other PBs can read the four registers 31r of the multi FF 31 in the same cycle. When a user circuit is mapped onto a reconfigurable device, since the PB 13y shown in FIG. 26 includes a storage unit 30 with a simple construction, it is easy to merge functions when mapping onto a device equipped with the PB 13y. That is, when the configuration data for mapping onto the device equipped with a PB 13y is generated, the rules for assigning the input/output registers in step 73a shown in FIG. 11 are relaxed like all of the four registers can read in each clock, which makes it easy to merge the functions after logic synthesis into one PB. To generate configuration data for mapping onto the device including the PB 13 shown in FIG. 2 or the PB 13z shown in FIG. 25, it is necessary to adhere to a limitation (rule) that "only one or two registers can be selected and made targets for processing at any given moment in each clock cycle". On the other hand, when evaluating the types of PBs from the viewpoint of manufacturing the device, the type of PB shown in FIG. 2 or FIG. 25 may be preferable to the type of the PB 13y shown in FIG. 26. Since the number of output lines to the configurable routing matrix 15 is larger for the type of the PB 13y shown in FIG. 26, an excessive amount of silicon area would be required.

Figure 27:
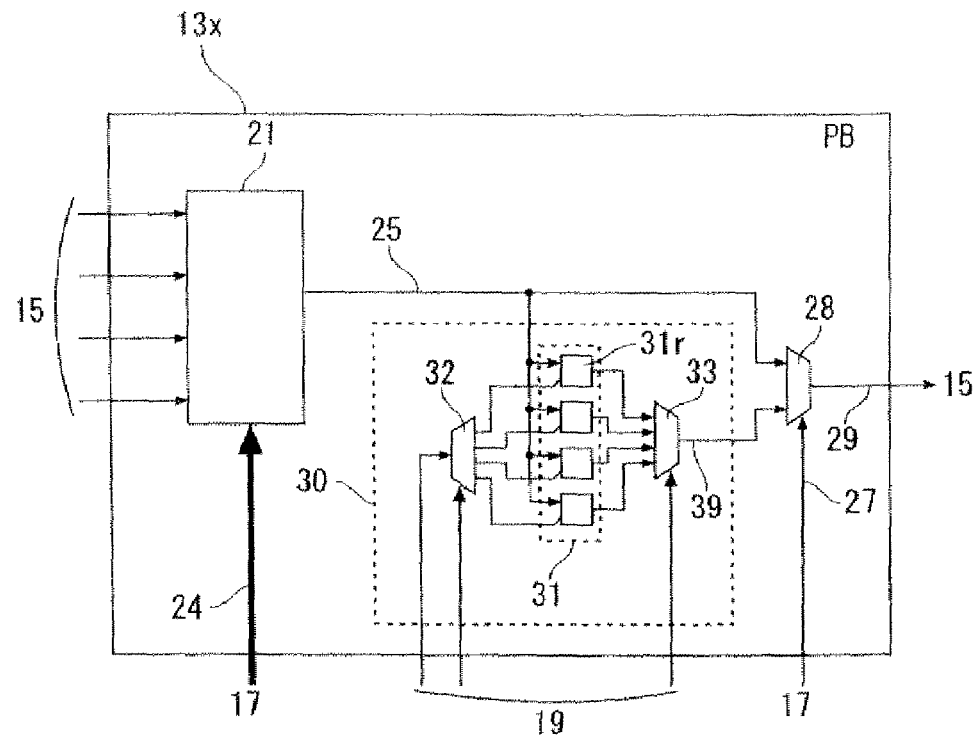
FIG. 27 is a block diagram showing yet another example of a processing block.

The PB 13x shown in FIG. 27 is equipped with an output selection unit (output selector) 28 that selects one of an output 39 from the storage unit 30 and an output 25 of the logic operation unit (LOU) 21 and outputs to the configurable routing matrix 15. The output selection unit 28 includes a selector that is controlled by the routing matrix output selection information 27 in the configuration data 17. In the PB 13x, since there is only one output signal to the configurable routing matrix 15, the construction of the configurable routing matrix 15 becomes simple.

Figure 28:
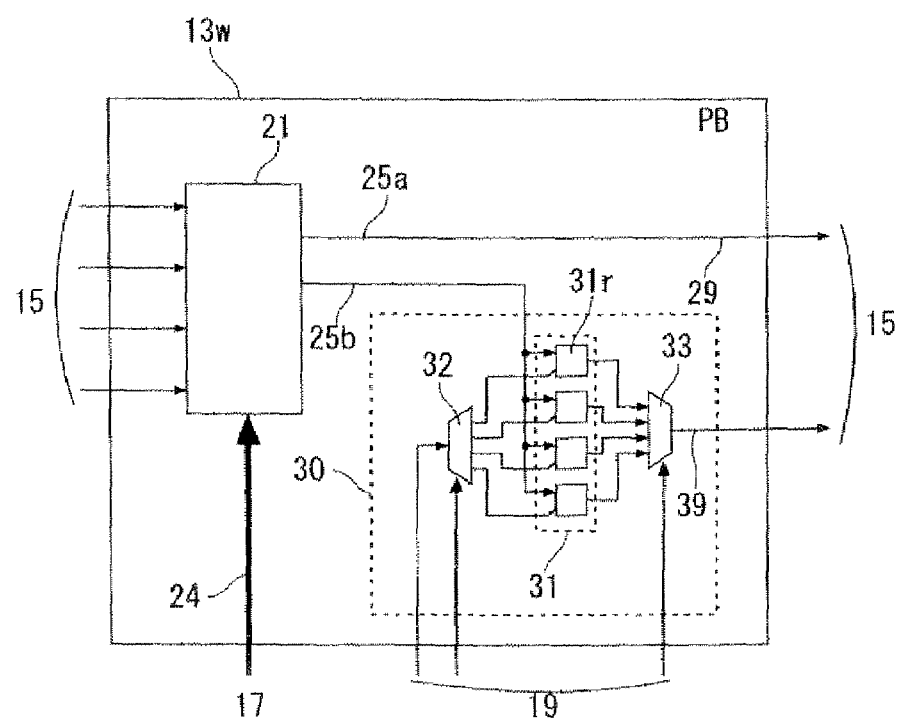
FIG. 28 is a block diagram showing yet another example of a processing block.

In the PB 13w shown in FIG. 28, the logic operation unit (LOU) 21 has two outputs 25a and 25b. One of the output results 25b is latched in the multi FF 31 of the storage unit 30 and the other output result 25a is outputted to the configurable routing matrix 15. The other variation relating to this PB 13w is providing a processing blocks PB that are equipped with a plurality of storage units 30 that respectively latch the outputs 25a and 25b. Providing a device equipped with such type of processing blocks is also included in one of the variations.

Figure 29:
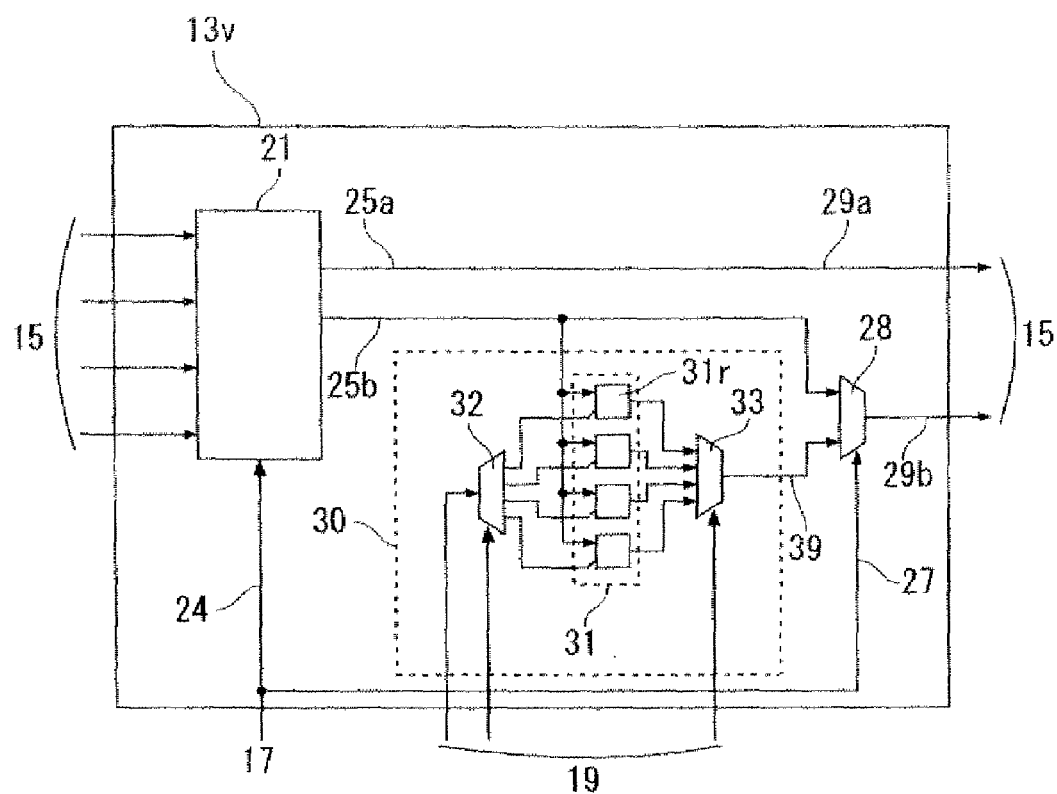
FIG. 29 is a block diagram showing yet another example of a processing block.

The PB 13v shown in FIG. 29 is equipped with an output selection unit 28 that selects either one of the outputs 25b or the output 39 from the storage unit 30 and outputs to the routing matrix 15. It is also possible to provide such processing blocks PB 13v and a device equipped with processing blocks PB 13v.

Figure 30:
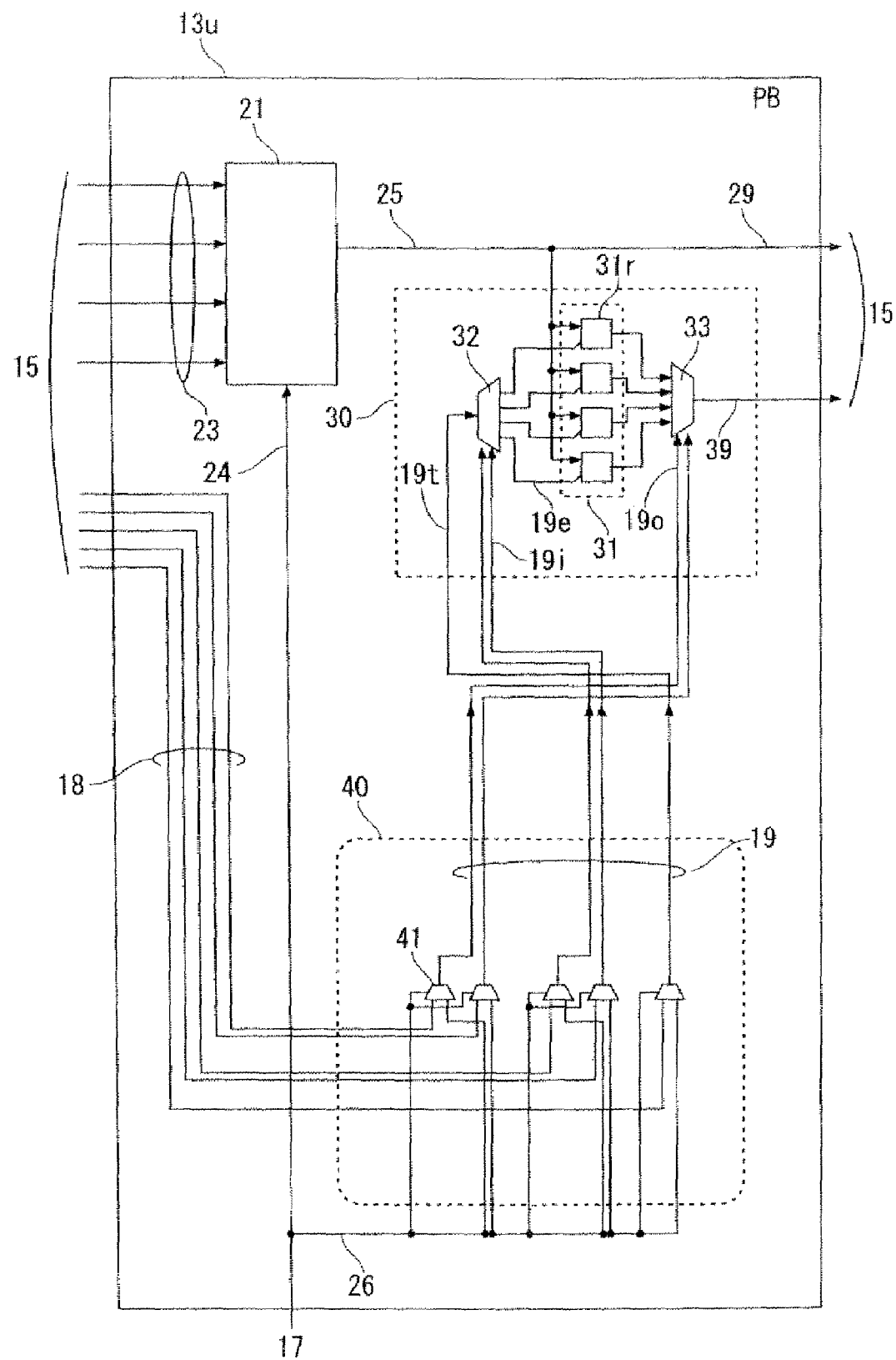
FIG. 30 is a block diagram showing yet another example of a processing block.

The PB 13u shown in FIG. 30 has a storage control unit 40 for outputting the respective signals 19 that control the storage unit 30 incorporated therein. This storage control unit 40 is controlled by the storage control components 26 of the configuration data 17. Since the storage control unit 40 is incorporated in the PB 13, the respective storage units 30 can be controlled by the configuration data 17 supplied to each PB 13 (in units of PBs). This means that it is possible to control the storage unit 30 even more flexibly according to the configuration data 17. On the other hand, since the respective PB 13 includes a storage control unit 40 therein, the area for implementing is increased, resulting in a tendency for an increase in the silicon area for implementing the device 10.

Figure 31:
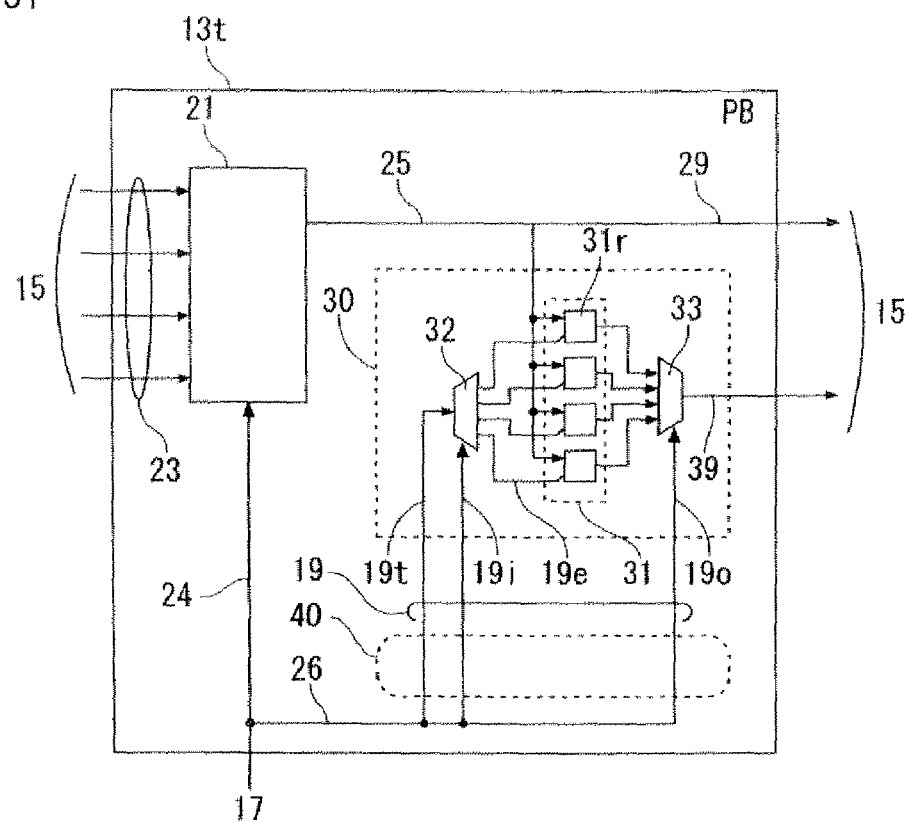
FIG. 31 is a block diagram showing yet another example of a processing block.

The PB 13t shown in FIG. 31 also has a storage control unit 40 for outputting the respective signals 19 that control the storage unit 30 incorporated therein, but with the storage control unit 40 being controlled according to only the configuration data 17. This type of the PB 13t can suppress increases in the area of the PB 13t due to the incorporation of the storage control unit 40. On the other hand, to reflect the operation result of another PB 13 in the control of the storage unit 30, it is necessary to change the configuration data 17 supplied to the PB 13t according to such operation result. The amount of configuration data 17 for mapping user circuits may increase.

Figure 32:
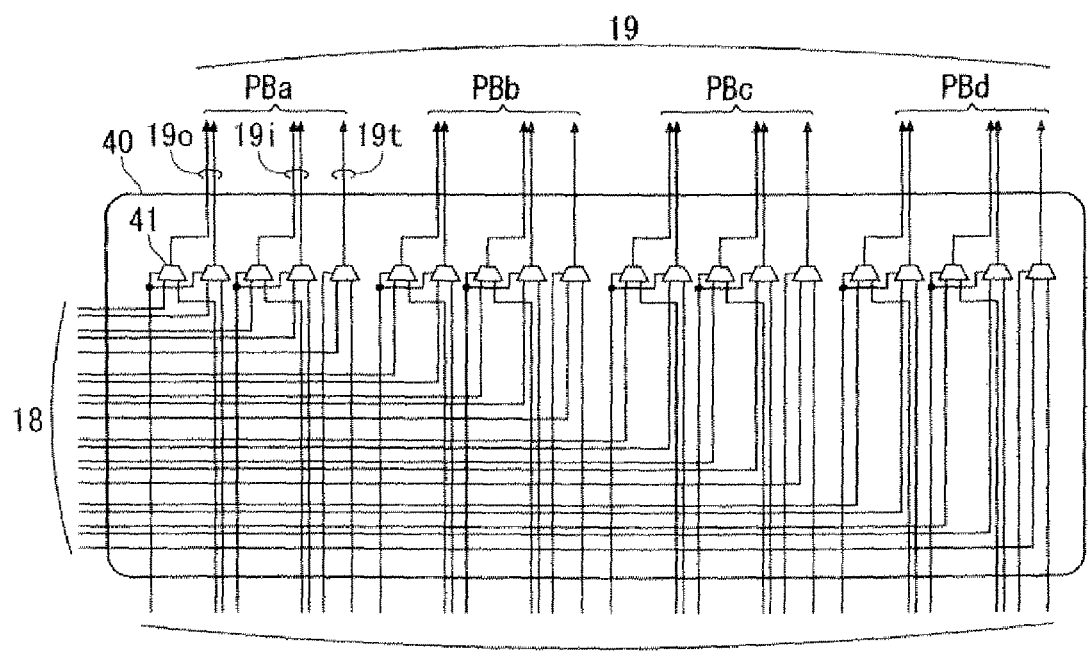
FIG. 32 is a block diagram showing a different example of a storage control unit.

FIG. 32 shows a different example of a storage control unit 40 that generates control signals 19 for the storage units 30 of a plurality of PBs 13. To reduce the silicon area of the storage control unit 40 shown earlier in FIG. 4, by designating the number(s) of the PBs 13 in the configuration data 17, it is possible to select the source of the storage control signal 19, out of the signal 18 from the routing matrix 15 and the configuration data 17. In the storage control unit 40 shown in FIG. 32, the storage units 30 of only four PBs are controlled as one group, with it being possible to select the respective storage units 30 from the configuration data 17. This provides greater flexibility to the one of FIG. 4, for controlling the storage units 30, but increases the silicon area required for implementation.

Figure 33:
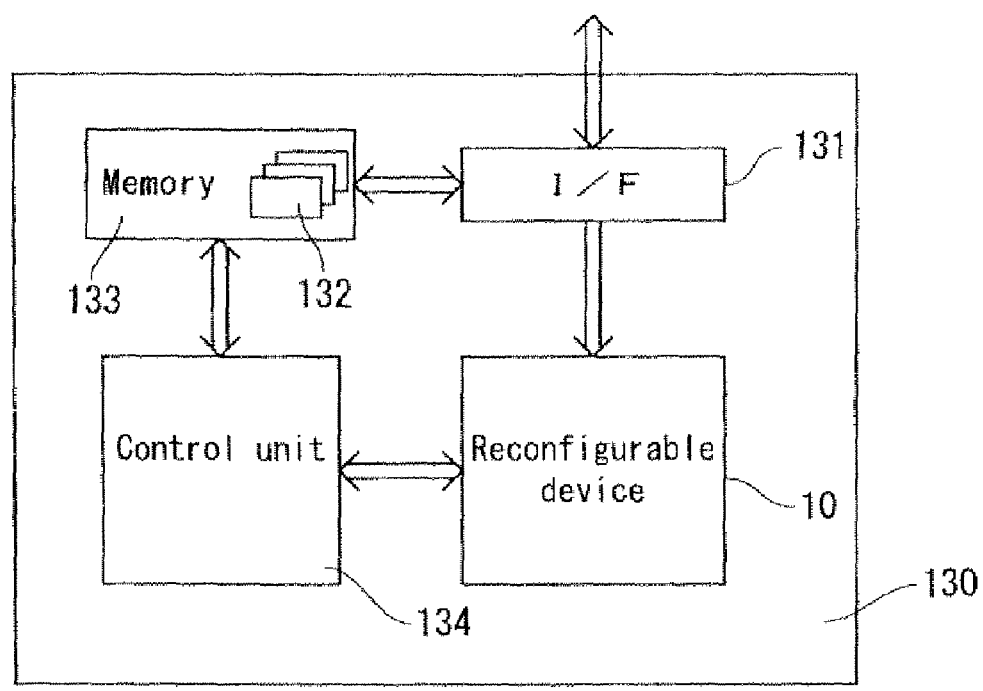
FIG. 33 is a block diagram showing one example of a data processing apparatus including a reconfigurable device.

FIG. 33 is a block diagram of a data processing apparatus 130 that is based on a reconfigurable device 10. The data processing apparatus 130 includes a device 10 and an interface 131 for inputting and outputting data that is processed by the device 10. The data processing apparatus 130 further includes a memory 133 for storing a group or block of a plurality of configuration data or a configuration data file 132 and a control unit 134 for setting the content of the configuration data 132 in the reconfigurable device 10. The control unit 134 is a general-purpose processor such as a RISC and switches the configuration data 17 set or stored in the configuration memory 11 included in the reconfigurable device 10. By doing so, the reconfigurable device 10 can be used for an even greater variety of purposes. By making it possible to change the content of the memory 133 from outside via an interface 131, it is possible to further increase the general-purpose applicability of the data processing apparatus 130. By realizing the functions of the control unit 134 in the reconfigurable device 10, it is also possible to omit the control unit 134.

The interface 131 mainly supports a physical interface mechanism. When analog processing is required as processing that exchanges data via communication lines, the interface 131 also supports an analog circuit for doing so. Digital processing that exchanges data via the communication lines can also be supported using the reconfigurable device 10. By supporting the functions of the interface or one part thereof rising the reconfigurable device 10, it is possible to provide a device that is not dependent on data types or protocols for exchanging data, or in other words, a "general-purpose" data processing apparatus. Applications where this data processing apparatus 130 can be used include a general-purpose processing device as represented by a program-based CPU, a network processing device such as a router, an image processing device including functions such as a decoder and encoder, and a communication, device such as a wired or wireless telephone.

The reconfigurable integrated circuit device described above has a plurality of PBs 13 that include storage units 30 and each storage unit 30 is equipped with a multi FF 31. In each PB 13, the multi FF 31 is controlled by the configuration data 17, the output 25 of the logic operation unit 21 is latched by the multi FF 31 and independent of this, processing results latched by the registers 31*r* of the multi FF 31 can be outputted. Accordingly, it is possible to greatly improve the usage efficiency of the individual PB 13 and to implement a user circuit with reduced hardware resources. Since it is possible to prevent insufficiencies of hardware resources from occurring, it is easy to raise the parallelism and improve the processing speed.

Note that the devices and processing blocks described above are only examples of reconfigurable devices included in the present invention and the present invention is not limited to the circuits described above. The integrated circuit device described above can be provided in the form of chips or other independent system. The semiconductor devices such as LSIs and ASICs including the integrated circuit device described above are also included in the present invention. Although examples where the present invention has been adapted to a device that is based on semiconductor integrated circuit technology, for example, an LSI, has been described, it is possible to apply the present invention to a reconfigurable device for forming a network circuitries, and to all data processing apparatuses that include a reconfigurable device or are based on a reconfigurable device. That is, the present invention is not limited to a circuit device that is based on circuit technology at an electric or electronic level, and the present invention can be applied to all reconfigurable devices that form a network based on optic, organic, molecular or atomic structures, genetic structures, and the like.

What is claimed is:

1. A system for generating configuration data for a reconfigurable device,
wherein the device comprises:
a plurality of processing blocks, wherein operation logic of each processing block is changeable; and
a routing matrix for reconfiguring paths that connect the plurality of processing blocks,
wherein each processing block comprises:
a logic operation unit whose logic is determined by the configuration data; and
a storage unit for storing operation results of the logic operation unit,
the storage unit comprises: a plurality of storage elements;
an input selector that selects any one of the plurality of storage elements designated by the configuration data in each clock cycle and storing an output of the logic operation unit; and
an output selector that connects any one of the plurality of storage elements designated by the configuration data in each clock cycle to the routing matrix independently to the input selector, and the system comprises:
means for generating clock cycle-based RTL descriptions for a user circuit;
means for carrying out logic synthesis of the clock cycle-based RTL descriptions in each clock cycle; and
means for generating the configuration data that assign a different register of inputting or outputting of each clock cycle that is included in clock cycle-based circuits provided by the logic synthesis to a different storage element that is included in the plurality of storage elements in each clock cycle by controlling the input selector and the output selector of the storage unit in each clock cycle according to the configuration data when mapping the clock cycle-based circuits onto the plurality of processing blocks.

2. A method of generating configuration data for a reconfigurable device by a computer,
wherein the device comprises:
a plurality of processing blocks, wherein operation logic of each processing block is changeable; and
a routing matrix for reconfiguring paths that connect the plurality of processing blocks,
wherein each processing block comprises:
a logic operation unit whose logic is determined by the configuration data; and
a storage unit for storing operation results of the logic operation unit,
the storage unit comprises: a plurality of storage elements; input selector that selects any one of the plurality of storage elements designated by the configuration data in each clock cycle and storing an output of the logic operation unit; and output selector that connects any one of the plurality of storage elements designated by the configuration data in each clock to the routing matrix independently to the input selector, and
the method comprises:
generating clock cycle-based RTL descriptions for a user circuit;
carrying out logic synthesis of the clock cycle-based RTL descriptions in each clock cycle; and
generating the configuration data that assign a different register of inputting or outputting that is included in clock cycle-based circuits provided by the logic synthesis to a different storage element that is included in the plurality of storage elements in each clock cycle by controlling the input selector and the output selector of the storage unit in each cycle according to the configuration data when mapping the clock cycle-based circuits onto the plurality of processing blocks.

3. The system according to claim 1,
wherein the device further comprises a first output that connects the output of the logic operation unit to the routing matrix with bypassing the plurality of storage elements, and
wherein the output selector select an output among the first output and the plurality of storage elements designated by the configuration data in each clock cycle and connects selected output to the routing matrix, and
wherein the means for generating the configuration data includes means for generating the configuration data that control the output selector in each clock cycle so as to select an output among the first output and the plurality of storage elements in each clock cycle and connect selected output to the routing matrix.

4. The method according to claim 2,
wherein the device further comprises a first output that connects the output of the logic operation unit to the routing matrix with bypassing the plurality of storage elements, and
wherein the output selector select an output among the first output and the plurality of storage elements designated by the configuration data in each clock cycle and connects selected output to the routing matrix, and
wherein the generating the configuration data includes generating the configuration data that control the output selector in each clock cycle so as to select an output among the first output and the plurality of storage elements in each clock cycle and connect selected output to the routing matrix.

5. A computer program product tangibly embodied in a computer-readable storage device and comprising instructions of generating configuration data for a reconfigurable device,
wherein the device comprises:
a plurality of processing blocks, wherein operation logic of each processing block is changeable; and
a routing matrix for reconfiguring paths that connect the plurality of processing blocks,
wherein each processing block comprises:
a logic operation unit whose logic is determined by the configuration data; and
a storage unit for storing operation results of the logic operation unit,
the storage unit comprises: a plurality of storage elements; input selector that selects any one of the plurality of storage elements designated by the configuration data in each clock cycle and storing an output of the logic operation unit; and output selector that connects any one of the plurality of storage elements designated by the configuration data in each clock to the routing matrix independently to the input selector, and
the instructions of generating includes instructions of:
generating clock cycle-based RTL descriptions for a user circuit;
carrying out logic synthesis of the clock cycle-based RTL descriptions in each clock cycle; and
generating the configuration data that assign a different register of inputting or outputting that is included in clock cycle-based circuits provided by the logic synthesis to a different storage element that is included in the plurality of storage elements in each clock cycle by controlling the input selector and the output selector of the storage unit in each cycle according to the configuration data when mapping the clock cycle-based circuits onto the plurality of processing blocks.

* * * * *